US012727260B2

(12) United States Patent
Lischke

(10) Patent No.: US 12,727,260 B2
(45) Date of Patent: Sep. 1, 2026

(54) DIODE WITH LIGHT-SENSITIVE INTRINSIC REGION

(71) Applicant: IHP GmbH—Innovations for High Performance Microelectronics/Leibniz-Institut fur Innovative Mikroele, Frankfurt (DE)

(72) Inventor: Stefan Lischke, Frankfurt (DE)

(73) Assignee: IHP GMBH-INNOVATIONS FOR HIGH PERFORMANCE MICROELECTRONICS/LEIBNIZ-INSTITUT FUR INNOVATIVE MIKROELEKTRONIK, Frankfurt (DE)

( * ) Notice: Subject to any disclaimer, the term of this patent is extended or adjusted under 35 U.S.C. 154(b) by 465 days.

(21) Appl. No.: 18/022,336

(22) PCT Filed: Aug. 27, 2021

(86) PCT No.: PCT/EP2021/073776
§ 371 (c)(1),
(2) Date: Feb. 21, 2023

(87) PCT Pub. No.: WO2022/043513
PCT Pub. Date: Mar. 3, 2022

(65) Prior Publication Data

US 2025/0006856 A1 Jan. 2, 2025

(51) Int. Cl.
*H10F 30/223* (2025.01)
*H10F 71/00* (2025.01)
(Continued)

(52) U.S. Cl.
CPC ......... *H10F 30/223* (2025.01); *H10F 71/121* (2025.01); *H10F 77/12* (2025.01);
(Continued)

(58) Field of Classification Search
CPC .. H10F 30/223; H10F 71/121; H10F 71/1215; H10F 77/12; H10F 77/147;
(Continued)

(56) References Cited

U.S. PATENT DOCUMENTS 7,603,016 B1 * 10/2009 Soref .................... B82Y 20/00 385/129
2002/0115300 A1 8/2002 Yang et al.
(Continued)

FOREIGN PATENT DOCUMENTS

CN 110494800 A 11/2019
EP 3 096 362 B1 11/2016
WO 2019/229532 A1 12/2019

OTHER PUBLICATIONS

Lucovsky et al. "Transit-Time Considerations in p—i—n Diodes" J. Appl. Phys. 35, 622-628 (1964) https://doi.org/10.1063/1.1713426 (Year: 1964).*

(Continued)

*Primary Examiner* — Sitaramarao S Yechuri
(74) *Attorney, Agent, or Firm* — Francis J. Maguire; WARE FRESSOLA MAGUIRE & BARBER LLP

(57) ABSTRACT

A diode comprises a p-doped region, an n-doped region, and a light-sensitive intrinsic region sandwiched laterally between the p-doped region and the n-doped region in a direction transverse to a direction of light propagation in the diode. The p-doped region is made of a first material doped with a first type of dopant and the n-doped region is made of a third material doped with a second type of dopant. The first material includes Si or SiGe. The third material includes Si or SiGe. The intrinsic region is made of a second material, that includes Ge, GeSn, or SiGe. The intrinsic region has a maximal lateral extension between two lateral ends of the intrinsic region of equal to or below 400 nm. The p-doped (Continued)

region and the n-doped region are in-situ doped such that the intrinsic region is not doped when the diode is produced.

20 Claims, 29 Drawing Sheets

(51) Int. Cl.
*H10F 77/12* (2025.01)
*H10F 77/14* (2025.01)
*H10F 77/20* (2025.01)
*H10F 77/40* (2025.01)
*G02F 1/015* (2006.01)
*G02F 1/025* (2006.01)

(52) U.S. Cl.
CPC ......... *H10F 77/147* (2025.01); *H10F 77/206* (2025.01); *H10F 77/413* (2025.01); *G02F 1/0157* (2021.01); *G02F 1/025* (2013.01)

(58) Field of Classification Search
CPC .... H10F 77/206; H10F 77/413; H10F 77/122; H10F 77/148; G02F 1/0157; G02F 1/025; Y02P 70/50
See application file for complete search history.

(56) References Cited

U.S. PATENT DOCUMENTS

| | | | | |
|---|---|---|---|---|
| 2003/0122210 | A1* | 7/2003 | Cohen | H10F 71/121 257/293 |
| 2012/0097977 | A1 | 4/2012 | Yamaguchi | |
| 2013/0020668 | A1* | 1/2013 | Qian | G02B 6/12004 257/E31.127 |
| 2013/0182305 | A1 | 7/2013 | Feng et al. | |
| 2015/0016769 | A1* | 1/2015 | Verma | G02B 6/12004 438/69 |
| 2015/0277157 | A1 | 10/2015 | Jones et al. | |
| 2018/0101082 | A1 | 4/2018 | Yu et al. | |
| 2020/0089076 | A1 | 3/2020 | Yu et al. | |
| 2021/0223478 | A1* | 7/2021 | Song | G02B 6/29344 |
| 2021/0234058 | A1* | 7/2021 | Zhang | H10F 71/121 |
| 2025/0006856 | A1* | 1/2025 | Lischke | H10F 77/122 |

OTHER PUBLICATIONS

Lischke, et al; "Ge Photodiode with −3 dB OE Bandwidth of 110 GHz for PIC and ePIC Platforms"; 2020 IEEE International Electron Devices Meeting; Dec. 12, 2020; whole document.
Lischke, et al; "Advanced photonic BiCMOS technology with high-performance Ge photo detectors"; Enhanced and Synthetic Vision 2003; vol. 11088; Sep. 24, 2019; pp. 1-11; whole document.
Bouef, et al; "A Silicon Photonics Technology for 400 Gbit/s Applications"; IEEE 2019; pp. 33.1.1 to 33.1.4.
Chen, et al; "-1 V bias 67 GHz bandwidth Si-contacted germanium waveguide p-i-n photodetector for optical links at 56 Gbps and beyond"; Feb. 24, 2016; Optics Express Journal, vol. 24, No. 5; pp. 4622-4631.
Lischke, et al; "High bandwidth, high responsivity waveguide-coupled germanium p-i-n photodiode"; Optical Society of America 2015; whole document.
Virot, et al; "Integrated waveguide PIN photodiodes exploiting lateral Si/Ge/Si heterojunction"; Optics Express Journal vol. 25, No. 16; Aug. 3, 2017; pp. 19487-19496.
Vivien, et al; "Zero-bias 40Gbit/s germanium waveguide photodetector on silicon"; Optics Express Journal; vol. 20, No. 2; Jan. 4, 2012; pp. 1096-1101.
Chinese Search Report for Application No. 202180069940.4 filed Aug. 27, 2021 included with First Office Action dated May 28, 2026, 11 pages.

* cited by examiner 118
120
112
116
114
104
122
124
108
110
106
100
102
lateral 111
100

102
100

102
117
100
104
116
102

142
100

100
144

112
100

110
102
100

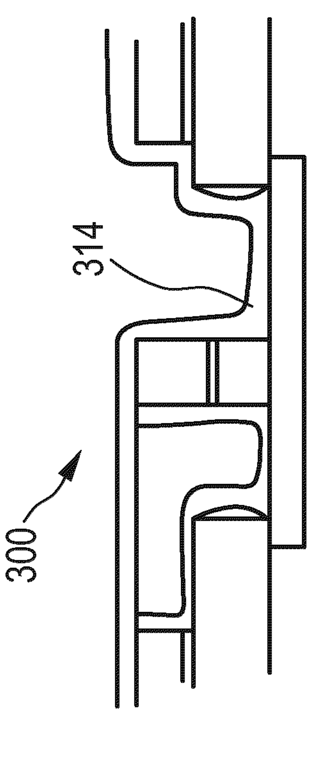
FIG. 21
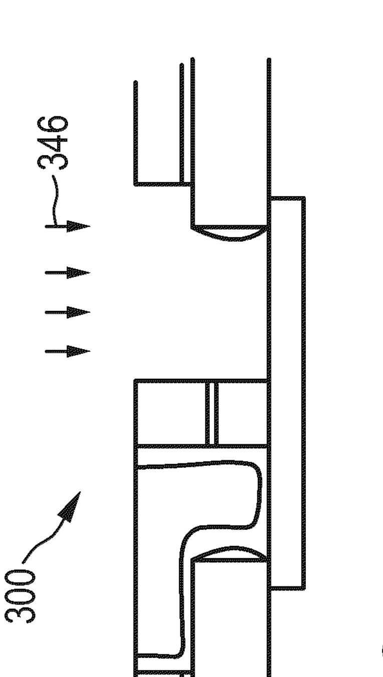
FIG. 20
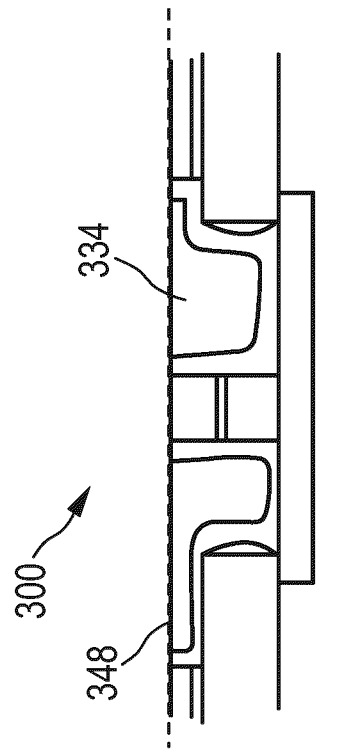
FIG. 22
300
350
316
FIG. 23

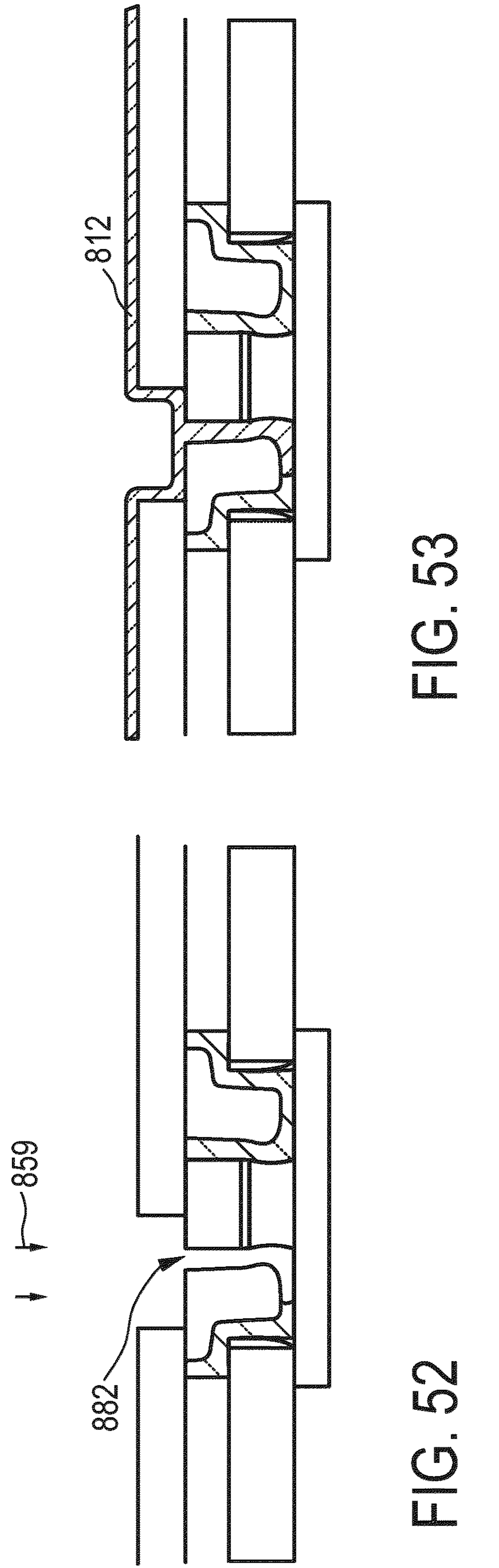
812
FIG. 53
859
882
FIG. 52
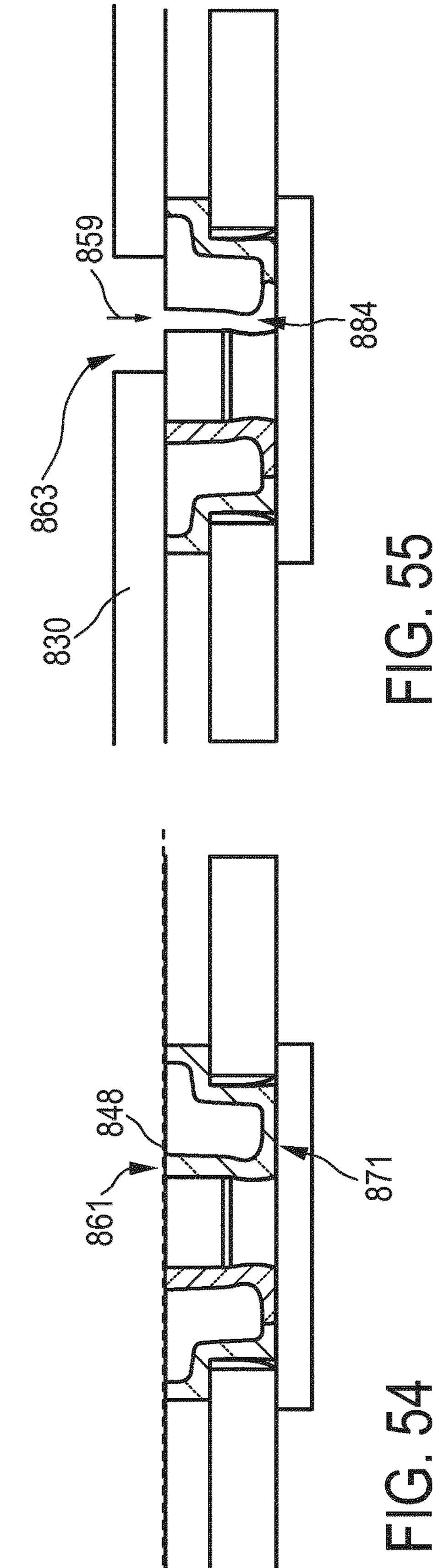
859
884
863
830
FIG. 55
848
861
871
FIG. 54

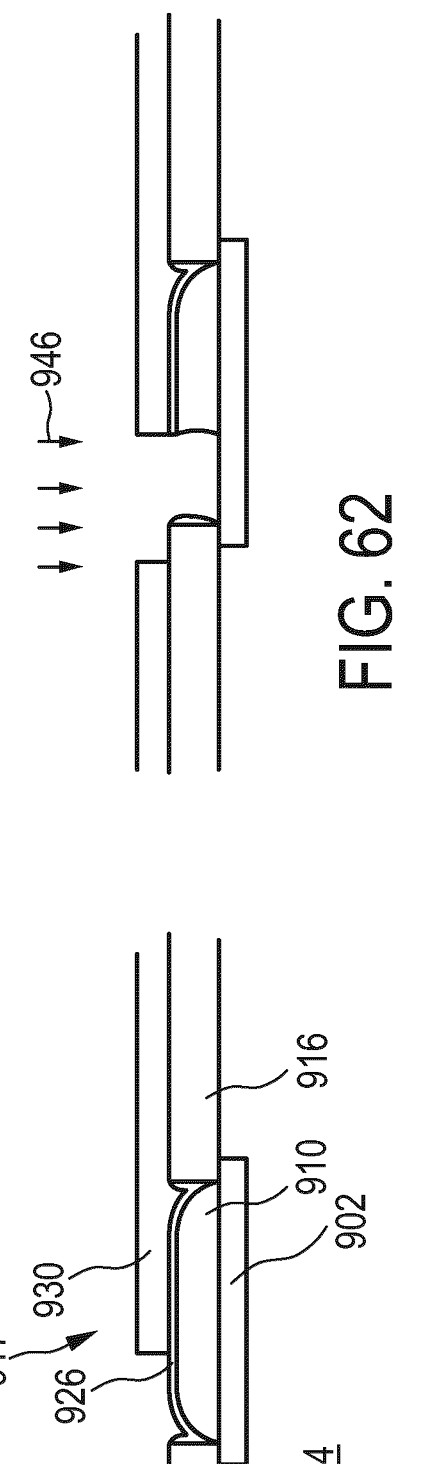
FIG. 62
FIG. 61
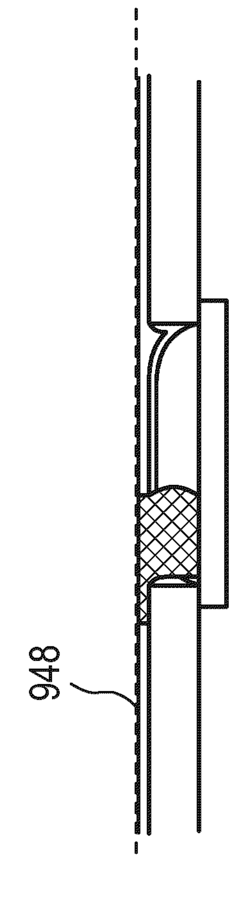
FIG. 64
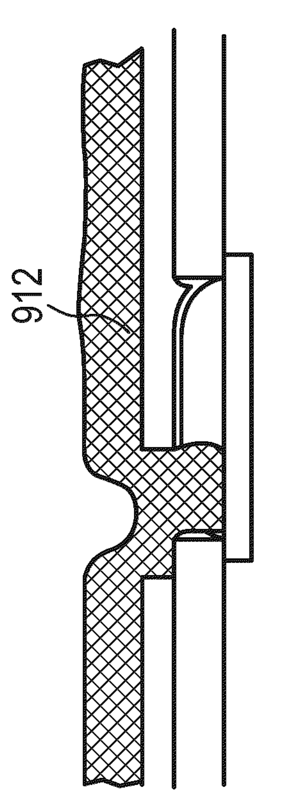
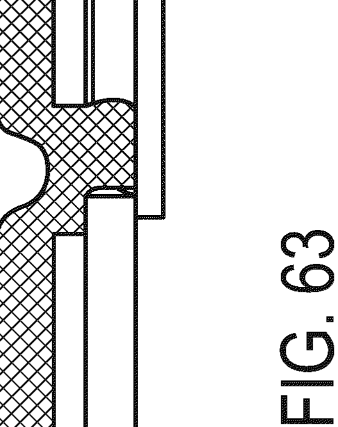
FIG. 63

DIODE WITH LIGHT-SENSITIVE INTRINSIC REGION

CROSS REFERENCE TO RELATED APPLICATIONS

This application is the U.S. National Stage of International Application Number PCT/EP2021/073776 filed on Aug. 27, 2021, which application claims priority under 35 USC § 119 to European Patent Application No. 20193424.7 filed on Aug. 28, 2020 and European Patent Application No. 20200240.8 filed on Oct. 6, 2020. All of these applications are hereby incorporated by reference in their entirety.

TECHNICAL FIELD

The invention relates to a diode comprising a light-sensitive intrinsic region sandwiched between a p-doped region and an n-doped region.

BACKGROUND OF THE INVENTION

Optical and optoelectronic components produced with a silicon-based technology are key components, for example, for optical telecommunications or for optical connections within or between microelectronics circuits. Examples of such components are couplers, wave-guides, modulators and photodetectors, in particular.

Modern photodetectors use, for example, germanium (Ge) as a detector material due to its significantly better absorbance compared to silicon (Si) in the wavelength range used for optical communication ($\lambda$=1.3-1.6 μm). A so called PIN diode is often used as a detector. "P" stands for a p-doped region, "I" for an intrinsic region and "N" for an n-doped semiconductor region. Important parameters of the diode are dark-current, photocurrent, responsivity and opto-electrical bandwidth.

Germanium photodiodes with an opto-electrical bandwidth of 50 GHz and more have al-ready been demonstrated.

Such germanium photodiodes are typically produced by epitaxial growth of a germanium layer directly on an SOI (silicon on insulator) substrate, which allows direct coupling of the detector to the waveguide made from the upper monocrystalline Si layer of the SOI structure. The light to be detected can thus be supplied parallel to the waveguide-diode interface, which allows the diode to be independently optimized, to a degree, with regard to responsivity and opto-electrical bandwidth.

The diodes are mostly contacted by the contact metal directly touching highly doped Ge regions which laterally or vertically adjoin the intrinsic Ge region. This results in losses because of light absorption by the metal electrodes and due to light absorption by free charge carriers in the doped Ge regions, thus limiting the responsivity of the diodes.

EP 3 096 362 B1 shows a diode which comprises a light-sensitive Ge region located on a waveguide made of Si or silicon germanium (SiGe) and which has lateral dimensions in a direction transverse to a direction of light propagation in the waveguide that are identical or at most 20 nm per side shorter in comparison with the waveguide.

US 2015/0016769 A1 shows a method for fabricating a semiconductor device which includes etching a waveguide layer in a detector region of a semiconductor substrate to form a recessed waveguide layer section. A ridge structure Ge photodetector is formed overlying a portion of the recessed waveguide layer section.

WO 2019/229532 A1 shows a Si based photodetector and method of manufacturing the same. The photodetector comprises a Si substrate, a buried oxide (BOX) layer above the Si substrate, and a waveguide above the BOX layer. The waveguide includes a Si containing region and a germanium tin (GeSn) containing region, both located between a first doped region and a second doped region of the waveguide, thereby forming a PIN diode. The first doped region and the second doped region are respectively connected to first and second electrodes, such that the waveguide is operable as a photodetector.

US 2018/101082 A1 shows an optoelectronic device with an optically active region (OAR) which may be, for example, a photodiode. The OAR may be formed, for example, primarily of SiGe. In one embodiment, a waveguide is disposed on top of a cladding layer. The waveguide comprises an intrinsic part, a first doped region, and a second doped region which are formed from the same material as the intrinsic part. The intrinsic part may be undoped, and so the OAR can be described as a p-i-n junction. As the intrinsic part extends away from the cladding layer, it may be described as a proud or rib waveguide where the rib is provided by the intrinsic part and a part of first and second doped regions which extend up the side of the intrinsic part and the slab is provided by a part of the doped regions which extends along the upper surface of the cladding layer. The cladding layer functions to confine light signals entering the OAR into the rib waveguide. The OAR may have a length between 30 μm and 60 μm.

US 2013/0182305 A1 shows an optical device including a ridge on a base. The ridge includes an active medium. An active component on the base is a light sensor and/or a light modulator. The active component is configured to guide a light signal through the active medium included in the ridge. Electrical current carriers contact the lateral sides of the ridge on opposing sides of the ridge. Each of the electrical current carriers includes a carrier material that is doped so as to increase the electrical conductivity of the carrier material. The carrier material is different from the active medium. The ridge may be formed based on etching with a hard mask formed on a device precursor such that regions where recesses that define the ridge are to be formed are exposed while the remainder of the active medium is protected.

SUMMARY OF THE INVENTION

It can be seen as an object of the present invention to provide a faster diode and a method for producing such a diode, in particular a method for producing a diode with a smaller lateral width.

According to the invention, a diode comprising a p-doped region, an n-doped region, and a light-sensitive intrinsic region sandwiched laterally between the p-doped region and the n-doped region in a direction transverse to a direction of light propagation in the diode is proposed. The p-doped region is made of a first material doped with a first type of dopant and the n-doped region is made of a third material doped with a second type of dopant. The first material includes Si or SiGe. The third material includes Si or SiGe. The intrinsic region is made of a second material different to at least one of the first material and the third material. The second material includes Ge, GeSn, or SiGe. The intrinsic region has a maximal lateral extension between two lateral ends of the intrinsic region, i.e., a lateral width of the intrinsic region, of equal to or below 400 nm, preferably equal to or below 300 nm, more preferably equal to or below 200 nm. The p-doped region and the n-doped region are in-situ doped such that the intrinsic region is not doped when the diode is produced.

This allows providing a diode with a light-sensitive intrinsic region essentially without dopants contacted with an n-doped region and a p-doped region made of a different material than the light-sensitive intrinsic region. As the intrinsic region serves as optically active region, e.g., detecting photons by the photoelectric effect, and is sandwiched laterally between the doped regions of which one or both are made of another material, photo carrier generation in the doped regions can be reduced compared to a diode in which the doped and intrinsic regions are made of the same material of the optically active region. The photo carriers may be generated essentially in the intrinsic region such that the photo carriers are influenced by the electric field provided between the doped regions. Photo carriers in doped regions may only diffuse, i.e., they move slowly, compared to the photo carriers influenced by the electric field. As a result the diode according to the invention may provide a larger opto-electrical bandwidth, which allows providing faster receivers. Methods for producing a diode with a light-sensitive intrinsic region with lateral width of equal to or below 400 nm and essentially without dopants contacted with an n-doped region and a p-doped region of which at one or both are made of a different material than the light-sensitive intrinsic region are not known in the prior art, i.e., diodes with such properties, in particular with a high bandwidth while having reasonable responsivity and dark-current, could not be produced in the prior art.

The light-sensitive intrinsic region sandwiched laterally between the p-doped region and the n-doped region in a direction transverse to a direction of light propagation in the diode is obtainable by sequentially providing the p-doped region in-situ doped and the n-doped region in-situ doped such that the intrinsic region has a maximal lateral extension between two lateral ends of the intrinsic region of equal to or below 400 nm, preferably equal to or below 300 nm, more preferably equal to or below 200 nm, and such that the intrinsic region is not doped when producing the diode. This method of producing the diode allows to achieve smaller lateral widths of the intrinsic region than in the prior art. Hence, diodes with smaller lateral widths may be produced. This allows to produce more diodes per area of a wafer and thus not only improves the properties of the diodes, but also reduces material costs. In particular, smaller lateral widths of the intrinsic region may be achieved as the lateral width of the intrinsic region depends on the accuracy in an overlay of masks, e.g., lithography masks, to each other and a precise adjustment of critical dimensions (CD). These may be very well controlled and are sharp enough for achieving smaller lateral widths of the intrinsic region. In other words, the achievable lateral width depends on a relative positioning of two masks, each for the p- and n-sides of the diode, or p-doped region and n-doped region, respectively. Therefore, the achievable lateral width is not limited by the resolution of the deployed device for etching trenches for the doped regions, e.g., an etching device such as a deep ultra violet (DUV) lithography device. Overlay accuracy and CD accuracy may be in a range of, for example, below 10 nm and 30 nm, respectively. This allows reliable fabrication of diodes with feature sizes of 100 nm or less, such that lateral widths of intrinsic regions of equal to or below 400 nm, preferably equal to or below 300 nm, more preferably equal to or below 200 nm, and most preferably equal to or below 140 nm may be achieved. Since smaller lateral widths of the intrinsic region allow higher electrical fields and shorter drift times of photo carriers, properties of the diodes may be further improved by reducing the lateral widths of the intrinsic region.

Since the lateral width of the intrinsic region of the diode is much smaller than in the prior art, negative effects of dopants contaminating the intrinsic region may become more severe. Producing the intrinsic region such that the intrinsic region is not doped when the diode is produced, i.e., including when the p-doped region and the n-doped region are produced, means that no active doping of the second material is performed for producing the diode and processing steps that increase the doping concentration in the intrinsic region are avoided as much as possible. This allows reducing negative effects of dopants as much as possible. While this does not exclude that dopants enter the intrinsic region due to diffusion or other non-active doping mechanisms, doping concentration within the intrinsic region may be reduced. The intrinsic region may, for example, include some dopants due to contamination of the second material, e.g., by diffusion of dopants into the second material and/or as the second material is not perfectly pure. The intrinsic region may include contacting parts each with a respective surface in direct contact with one of the doped regions. These contacting parts of the intrinsic region may be contaminated by diffusion of dopants while a central part, arranged in the center of the intrinsic region, may not be affected by diffusion of dopants. The contacting parts of the intrinsic region may have a higher dopant concentration than the remainder of the intrinsic region, for example, they may have a doping concentration of less than $10^{19}$ atoms/cm$^3$, e.g., less than $10^{18}$ atoms/cm$^3$, less than $10^{17}$ atoms/cm$^3$, or less than $10^{16}$ atoms/cm$^3$. The central part may have a smaller impurity concentration or doping concentration than the contacting parts of the intrinsic region, e.g., a doping concentration of less than $10^{16}$ atoms/cm$^3$, e.g., less than $10^{15}$ atoms/cm$^3$, less than $10^{14}$ atoms/cm$^3$, or 0.2 to $4 \cdot 10^{10}$ atoms/cm$^3$ or less. The central part may extend, for example, over more than 30%, e.g., one third, half, or two thirds of the lateral width of the intrinsic region. The lateral width is defined as the maximal lateral extension between the two lateral ends of the intrinsic region. For example, for an intrinsic region with a lateral width of 200 nm, the central part has at least a lateral width of 60 nm, such that the contacting parts of the intrinsic region which are in contact with the doped regions have a maximal lateral width of 70 nm in this case.

The first material and the third material may have the same or different material composition. The first, second, and third material may be made of a single element, e.g., Si, respectively Ge, or a mixture of elements, e.g., SiGe, with a certain amount of Si and a certain amount of Ge, e.g., 50% Si and 50% Ge, i.e., $Si_{0.5}Ge_{0.5}$. Alternatively, the first, second, and third material may include different material parts, or a gradient of its material composition. The gradient may be, for example, a lateral gradient, e.g., extending from one end of the region to another end of the region. When the region is grown on a respective surface, a lateral gradient refers to a lateral direction with respect to the respective surface on which the region is grown. For example, a doped region may have a lateral gradient of its material composition of 100% Si at its lateral end facing away from the intrinsic region and % Si and 90% Ge, i.e., $Si_{0.1}Ge_{0.9}$, at its lateral end in contact with the intrinsic region. The material of which a respective region is made may depend on a method for producing the respective region.

The diode may include one or more p-doped regions and one or more n-doped regions. The p-doped regions may be stacked above each other forming an overall p-doped region in form of a material stack of p-doped regions, e.g., made of different materials and/or including different doping concentrations and/or different dopants. The n-doped regions may be stacked above each other forming an overall n-doped region in form of a material stack of n-doped regions, e.g., made of different materials and/or including different doping concentrations and/or different dopants.

The maximal lateral extension of the intrinsic region between its two lateral ends may also be, for example, equal to or below 100 nm. For example, the maximal lateral extension of the intrinsic region between its two lateral ends may be between 200 nm and 300 nm, e.g., between 100 nm and 300 nm.

The maximal vertical extension of the intrinsic region, i.e., its vertical height, may be, for example, below 1000 nm, e.g., about 400 nm, e.g., 400 nm+/−10%, or between 300 nm and 400 nm.

The second material may have an impurity concentration or doping concentration of less than $10^{16}$ atoms/$cm^3$, less than $10^{15}$ atoms/$cm^3$, less than $10^{14}$ atoms/$cm^3$, or 0.2 to $4 \cdot 10^{10}$ atoms/$cm^3$ or less before processing it in order to produce the diode. The intrinsic region may also, for example, have a doping concentration of less than $10^{16}$ atoms/$cm^3$ in each part of the intrinsic region.

The proposed diode according to the invention is based on the realization that the intrinsic region should be as free of dopants as possible or at least an amount of dopants in the intrinsic region should be reduced in order to produce faster PIN diodes, e.g., faster photodiodes. The diode may allow to provide a reduced carrier generation in the doped regions neighboring the intrinsic region. Methods for producing a diode with a reduced amount of dopants in the intrinsic region or without doping the intrinsic region when producing the diode form part of the invention. Furthermore, providing the diode with a smaller lateral extension between two lateral ends of the intrinsic region and such that the intrinsic region is not doped when producing the diode by sequentially providing the p-doped region in-situ doped and the n-doped region in situ-doped forms part of the invention.

The diode may have, for example, a −3 dB bandwidth of more than 110 GHZ, preferably equal to or more than 200 GHZ, more preferably equal to or more than 240 GHZ, and most preferably equal to or more than 265 GHZ, and responsivity of more than 0.1 A/W, such as equal to or more than 0.2 A/W, for example, equal to or more than 0.3 A/W, e.g., more than 0.4 A/W, or more than 0.6 A/W, such as more than 0.7 A/W, while having a reasonable dark-current at −2 V of less than 500 nA, e.g., 300 nA to 400 nA, preferably less than 200 nA, e.g., between 100 nA and 200 nA, or less than 100 nA. The diode has an improved opto-electrical bandwidth and allows to provide a faster receiver.

The diode may be a photodiode. For example, a fast germanium photodiode may be provided that has a reasonable dark-current and good responsivity.

The p-doped region may be doped with, for example, boron atoms. The n-doped region may be doped with, for example, phosphorus atoms. Other dopants may be used for doping the n-doped region and/or the p-doped region. The doped regions may have, for example, a doping concentration of more than $5 \cdot 10^{19}$ atoms/$cm^3$, e.g., more than $10^{20}$ atoms/$cm^3$.

Contacting parts of the p-doped region and the n-doped region which directly contact the intrinsic region may be arranged in parallel to each other. This may allow an improved electrical field distribution in the intrinsic region with reduced curvature of the electrical field. Alternatively, or additionally, the p-doped region and n-doped region may be arranged in parallel to each other.

The contacting parts of the p-doped region and the n-doped region may be homogeneously doped in vertical direction. Alternatively, or additionally, the n-doped region and the p-doped region may be homogeneously doped in vertical direction. This may further improve the electrical field distribution in the intrinsic region by further reducing its curvature. The doped regions may be doped inhomogeneously along the lateral direction, e.g., with a gradient or with a higher doping concentration in the contacting parts of the doped-regions and/or a part of the doped regions to be connected with a metal connector.

The contacting parts of the p-doped region and the n-doped regions may have, for example, a vertical height higher than 20 nm, such as above 100 nm, above 200 nm, or, e.g., between 20 nm and 1000 nm, such as between 100 nm and 300 nm, or between 300 nm and 500 nm, such as 400 nm.

The lateral width of the p-doped region and the n-doped region may be, for example, below 1000 nm, e.g., between 100 nm and 1000 nm.

The p-doped region may have, for example, a L-like form, a mirror-inverted L-like form, or an U-like form. The n-doped region may have, for example, a L-like form, a mirror-inverted L-like form, or an U-like form. The p-doped region and the n-doped region may have mirror-inverted forms.

The intrinsic region may be in direct contact with the p-doped region and the n-doped region.

The diode may comprise a bottom layer or substrate arranged below the doped regions and the intrinsic region. The bottom layer may be made of, for example, Si or SiGe. The bottom layer may be, for example, a bulk wafer or a waveguide. The bottom layer may be arranged and/or embedded in a BOX layer, e.g., a SOI BOX layer, i.e., a BOX layer of a silicon on insulator (SOI) substrate. The BOX layer may be made from, for example, silicon dioxide ($SiO_2$).

The diode may comprise a waveguide. The waveguide may be, for example, made of Si or SiGe. The waveguide may be arranged below and in direct contact with at least the intrinsic region. The waveguide may extend to the lateral ends of the intrinsic region or beyond the lateral ends of the intrinsic region in lateral direction. The waveguide may, for example, extend beyond the lateral ends of the intrinsic region and end before a lateral end of the p-doped region and a lateral end of the n-doped region. Alternatively, the waveguide may extend beyond the p-doped region, the intrinsic region, and the n-doped region in lateral direction. The waveguide may be in direct contact with the p-doped region and the n-doped region. The waveguide may extend, for example, at least 100 nm, such as more than 500 nm, in lateral direction beyond the lateral end of the p-doped region. Alternatively, or additionally, the waveguide may extend, for example, at least 100 nm, such as more than 500 nm, in lateral direction beyond a lateral end of the n-doped region.

The waveguide may be, for example, a SOI waveguide. The waveguide may be arranged on a BOX layer, e.g., a $SiO_2$ layer. The buried oxide layer may be arranged on a substrate wafer, such as a Si wafer.

The intrinsic region may be sandwiched laterally between the p-doped region and the n-doped region such that the p-doped region and the n-doped region contact the intrinsic region only via vertical surfaces of the intrinsic region. This may improve the electrical field distribution in the intrinsic region.

In order to provide the p-doped region and the n-doped region in-situ doped such that the intrinsic region is not doped when the diode is produced, the intrinsic region may be structured by dry etching, such as reactive ion etching (RIE), and gaps generated by the dry etching may be filled with in-situ doped material for forming the p-doped and n-doped regions. In-situ doped regions allow high activation without additional thermal budget. The diode may be produced using in-situ doped regions without a thermal annealing step for activating the dopants, i.e., after providing and structuring the intrinsic region.

At least one of the p-doped region and the n-doped region may include a dopant gradient such that a doping concentration of the at least one of the p-doped region and the n-doped region is lowest in contact with the intrinsic region in order to reduce out diffusion of dopants into the intrinsic region. This allows to reduce contamination of the intrinsic region. The dopant gradient of the p-doped region and the n-doped region may be, for example, such that the doping concentration increases with lateral distance from the intrinsic region. For example, the doping concentration may increase from a lateral end of the at least one of the p-doped region and the n-doped region which is in contact with the intrinsic region to its opposing lateral end such that the doping concentration is lowest in contact with the intrinsic region. The doping concentration may be, for example, highest at a part of the doped region to be connected with a metal connector. The at least one of the p-doped region and the n-doped region may include two or more different dopants, e.g., arranged in two or more layers.

Alternatively or additionally, a buffer layer may be arranged between at least one of the p-doped region and the n-doped region with respect to the intrinsic region in order to reduce out diffusion of dopants into the intrinsic region. The buffer layer may be made of the material of the respective doped region. The buffer layer preferably has a lower doping concentration than the doped regions.

The intrinsic region may have a planar top surface. This allows improving the electrical field distribution by reducing, for example, curvature of the electric field in proximity to the top surface. The top surface may be structured, for example, by dry etching. Alternatively, the top surface may have any other form, e.g., a curved top surface.

The intrinsic region may have a planar bottom surface. Its vertical surfaces contacting the p-doped region and the n-doped region may be perpendicular to the planar bottom surface or have a convex or concave form such that the intrinsic region may have a biconvex or biconcave form. This allows to have an improved electric field distribution in the intrinsic region as the p-doped region and n-doped region may have corresponding perpendicular vertical surfaces or corresponding vertical surfaces which are positively contacting the form of the vertical surfaces of the intrinsic region. In particular, for the biconcave form of the intrinsic region, a minimal lateral extension between two lateral ends of the intrinsic region at its narrowest point, i.e., a smallest lateral width, is achieved in a center of the intrinsic region, where an optical intensity is the highest resulting in shortest transit times for photo carriers. A mean lateral width of the intrinsic region may be defined as mean between the lateral width and the smallest lateral width of the intrinsic region. The intrinsic region may be structured by, for example, a dry etching process, such as RIE. The planar bottom interface of the intrinsic region may be connected with a planar top surface of the waveguide. Material of the p-doped region and the n-doped region may extend into recesses caused by the biconcave form of the intrinsic region. Alternatively, a respective surface of the p-doped region and the n-doped region contacting a respective one of the convex vertical surfaces of the intrinsic region may have a positively contacting concave form. This allows to have a direct contact between the p-doped region and the intrinsic region, as well as between the n-doped region and the intrinsic region. Furthermore, the electrical field distribution in the intrinsic region may be improved. The direct contacts between the respective regions may be provided by providing the material of the p-doped region and the n-doped region after structuring the respective vertical surface of the intrinsic region, such that it may fill the recesses caused by the biconcave form of the intrinsic region or directly contact the convex vertical surfaces of the intrinsic region with its positively contacting concave form.

A respective contacting part of each of the p-doped region and the n-doped region which contacts the intrinsic region may extend vertically beyond a vertically highest point of the intrinsic region. This allows providing an additional capacitance above the intrinsic region. The respective contacting part of each of the p-doped region and the n-doped region which contacts the intrinsic region may extend vertically beyond a vertically highest point of the intrinsic region by at least 20 nm, for example, by more than 200 nm. Alternatively, the respective contacting part of each of the p-doped and the n-doped region which contacts the intrinsic region may also extend vertically to a same height as the highest point of the intrinsic region. This allows avoiding the additional capacitance above the intrinsic region.

The diode may comprise a capping layer, e.g., made of Si or SiGe, arranged on top of the intrinsic region. This allows providing a cap on top of the intrinsic region. The top interface, e.g., planar top interface, of the intrinsic region may be connected to a bottom interface, e.g., planar bottom interface, of the capping layer arranged on top of the intrinsic region. The respective contacting part of each of the p-doped region and the n-doped region which contacts the intrinsic region may extend vertically beyond a highest point of the capping layer arranged on top of the intrinsic region. Alternatively, the respective contacting part of each of the p-doped and the n-doped region which contacts the intrinsic region may also extend vertically to a same height as the highest point of the capping layer.

A silicide layer may be arranged on a top surface of each of the p-doped region and the n-doped region. The silicide layers may allow contacting the doped regions with electrodes. The silicide layers may be metal silicide layers. The metal silicide layers may be made, for example, of cobalt-disilicide ($CoSi_2$) or nickel silicide (NiSi). Nickel-based silicide layers may allow for reducing thermal budget. The silicide layers may be arranged such that they are not in direct contact with the intrinsic region. The silicide layer arranged on the top surface of the p-doped region may be arranged such that it is not in direct contact with the silicide layer arranged on the top surface of the n-doped region.

The diode may comprise vertically extending metal connectors. The vertically extending metal connectors may connect the silicide layers to metal structures. The metal structures may be arranged in a first horizontal structured metal plane. The metal structures may allow an operating voltage to be applied to the diode. This allows contacting the diode with electrodes. The metal connectors may be made, for example, of tungsten (W). The metal connectors may, for example, have the form of plugs or bars. The metal plane may include, for example, AlCu metal electrodes. The metal structures may be, for example, electrodes, such as AlCu metal electrodes.

The diode according to the invention, or any one of the embodiments as described herein, may advantageously be used as a photodiode or another optoelectronic component, such as an electro-absorption modulator.

In a further aspect of the invention, an optoelectronic component including a diode according to the invention or one of its embodiments and at least one additional optical or optoelectronic constituent, preferably monolithically as an integrated component, is provided. The optoelectronic constituent is preferably in optical communication with the diode. The optoelectronic constituent may be in optical communication with the diode, for example, via the waveguide. The at least one additional optical or optoelectronic constituent may be or may include one or more of a light emitter, a coupler for coupling light into or out of the waveguide, and a light modulator, such as an electro-absorption modulator.

The diode may be included or integrated, respectively into a photonic integrated circuit (PIC) or electronic photonic integrated circuit (EPIC). This may allow to provide improved PICs and EPICs.

In a further aspect of the invention, a method for producing a diode is presented. The method for producing a diode comprises the steps:

providing a light-sensitive intrinsic region sandwiched laterally between a p-doped region and an n-doped region in a direction transverse to a direction of light propagation in the diode by sequentially providing the p-doped region in-situ doped and the n-doped region in-situ doped such that the intrinsic region is not doped when producing the diode and such that the intrinsic region has a maximal lateral extension between two lateral ends of the intrinsic region of equal to or below 400 nm, preferably equal to or below 300 nm, more preferably equal to or below 200 nm. The p-doped region is made of a first material doped with a first type of dopant and the n-doped region is made of a third material doped with a second type of dopant. The first material includes Si or SiGe. The third material includes Si or SiGe. The intrinsic region is made of a second material different to at least one of the first material and the third material. The second material includes Ge, GeSn, or SiGe.

The method may comprise one or more of the steps:

providing a waveguide arranged below and in direct contact with at least the intrinsic region, providing the waveguide and the n-doped region such that the waveguide extends to the lateral ends of the intrinsic region or beyond the lateral ends of the intrinsic region in lateral direction, providing the waveguide, the p-doped region, the intrinsic region, and the n-doped region such that the waveguide extends beyond the p-doped region, the intrinsic region, and the n-doped region in lateral direction, providing the waveguide, the p-doped region, the intrinsic region, and the n-doped region such that the waveguide extends at least 100 nm in lateral direction beyond the lateral end of the p-doped region and at least 100 nm in lateral direction beyond the lateral end of the n-doped region, providing the intrinsic region such that it has a central part with a doping concentration of less than $10^{16}$ atoms/$cm^3$, providing the intrinsic region such that it is in direct contact with the p-doped region and the n-doped region, providing the intrinsic region sandwiched laterally between the p-doped region and the n-doped region such that the p-doped region and the n-doped region contact the intrinsic region only via vertical surfaces of the intrinsic region, providing the intrinsic region and the waveguide, such that the intrinsic region has a planar bottom surface, structuring the intrinsic region such that its vertical surfaces contacting the p-doped region and the n-doped region are perpendicular to the planar bottom surface or have a convex or concave form such that the intrinsic region has a biconvex or biconcave form, structuring the intrinsic region by a dry etching process, structuring the intrinsic region by a RIE process, providing the intrinsic region sandwiched laterally between the p-doped region and the n-doped region such that material of the p-doped region and the n-doped region extends into recesses caused by the biconcave form of the intrinsic region, providing the intrinsic region sandwiched laterally between the p-doped region and the n-doped region such that a respective surface of the p-doped region and the n-doped region contacting a respective one of the convex vertical surfaces of the intrinsic region has a positively contacting concave form, providing a respective contacting part of each of the p-doped region and the n-doped region such that it contacts the intrinsic region and further extends vertically beyond a vertically highest point of the intrinsic region, providing a capping layer, e.g., made of Si or SiGe, on top of the intrinsic region, providing a silicide layer on a top surface of each of the p-doped region and the n-doped region, providing metal structures in a first horizontal structured metal plane which allow an operating voltage to be applied to the diode and vertically extending metal connectors such that the vertically extending metal connectors connect the silicide layers to the metal structures.

The method may also comprise a step of providing the intrinsic region such that it has a central part with a doping concentration smaller than a doping concentration of the contacting parts of the intrinsic region which are in contact with the doped regions.

In one embodiment of the method, the method comprises the steps:

optionally providing a wafer, e.g., a Si wafer, optionally providing a BOX layer, e.g., a buried oxide layer of a SOI substrate, such as a $SiO_2$ layer, optionally providing the BOX layer on top of the wafer, optionally providing the waveguide on top of the BOX layer or on top of the wafer, providing an epitaxial growth window defining a diode region, providing the intrinsic region made of the second material in the diode region, optionally providing a capping layer, e.g., made of Si, on top of the intrinsic region, providing a mask, e.g., a hardmask, such as a $SiO_2$ hardmask, on top of a part of the diode region, e.g., arranged above a part of the intrinsic region, optionally removing, for example, dry etching, e.g., performed by RIE, part of the capping layer, removing, for example, dry etching, e.g., performed by RIE, part of the intrinsic region in the diode region,
providing an in-situ doped region made of the first material doped with the first type of dopant or made of the third material doped with the second type of dopant in the diode region in order to provide one of the p-doped and n-doped regions,
optionally removing parts of the in-situ doped region outside of the diode region and above the mask, e.g., by chemical mechanical polishing (CMP), for example, further using a stopping layer, such as silicon nitride (SiN or $Si_3N_4$), as known in the prior art,
optionally providing insulator material, e.g., $SiO_2$, on top of the in-situ doped region inside of the diode region,
removing a part of the mask, e.g., by lithography and/or dry etching, such that one part of the mask covers a part of the intrinsic region between the removed part of the mask and the in-situ doped region in order to provide the intrinsic region sandwiched laterally between the p-doped region and the n-doped region,
optionally removing, e.g., dry etching, part of the capping layer in the region of the removed part of the mask,
removing, e.g., dry etching, part of the intrinsic region in the region of the removed part of the mask,
providing another in-situ doped region in the diode region in order to provide the other one of the p-doped and n-doped regions, the other in-situ doped region being made of the third material doped with the second type of dopant or made of the first material doped with the first type of dopant,
optionally removing parts of the other in-situ doped region outside of the diode region and above the in-situ doped region,
optionally providing insulator material, e.g., $SiO_2$, on top of the other in-situ doped region in the region of the removed part of the mask,
optionally removing the insulator material on top of the in-situ doped regions,
optionally providing a silicide layer, e.g., a metal silicide layer made of for example, $CoSi_2$ or NiSi, on top of each of the in-situ doped regions,
optionally contacting the silicide layers with metal structures, e.g., by providing metal connectors between the silicide layers to a metal layer including the metal structures.

Since the diode is produced using in-situ doped regions, it is ensured that the intrinsic region is not doped when producing the diode.

The epitaxial growth window may be defined by an insulator region, e.g., made from $SiO_2$. The epitaxial growth window may be provided above the waveguide or above the wafer.

The intrinsic region may be grown by selective epitaxy. The intrinsic region may be grown, for example, selectively on the waveguide. The intrinsic region may then be structured during the production of the diode. For example, parts of the intrinsic region may be removed, e.g., by dry etching, for structuring the intrinsic region.

The capping layer may be grown over the whole wafer, e.g., by differential growth. The capping layer may be removed outside of the diode region, e.g., by CMP.

The in-situ doped regions may be provided by selective growth or differential growth. Selective growth allows providing the in-situ doped regions selectively on certain surfaces in the diode region, e.g., growing the in-situ doped regions selectively on the certain surfaces. Selective growth may require several steps of adding and removing in-situ doped material on the surfaces of the diode. In case differential growth is used for providing the in-situ doped regions, some of the optional steps have to be performed, i.e., they become mandatory, in order to remove parts of the in-situ doped regions, e.g., arranged over the intrinsic region. For example, CMP may be performed for removing these doped regions.

The first type of dopant includes dopants resulting in a p-doping, such that the in-situ doped region made of the first material doped with the first type of dopant is p-doped. The in-situ doped region made of the third material doped with the second type of dopant is n-doped. The method for producing the diode may first provide the in-situ p-doped region and after-wards the in-situ n-doped region, or vice versa.

The step of providing insulator material on top of the in-situ doped region inside of the diode region may be performed before or after the optional step of removing parts of the in-situ doped region outside of the diode region and above the mask. In case that parts of the in-situ doped region are arranged above the mask, these parts are preferably removed before removing a part of the mask.

The insulator material provided on top of the in-situ doped region made of the first material doped with the first type of dopant inside of the diode region may be provided on top of the diode before parts of the respective in-situ doped region outside of the diode region are removed. The same holds true for the insulator material provided on top of the in-situ doped region made of the third material doped with the second type of dopant inside of the diode region. In this case, the insulator material outside of the diode region may be removed as well in the same processing step. Alternatively, the insulator material outside of the diode region may be removed in a subsequent processing step, e.g., by CMP, for example, further using a stopping layer.

The silicide layers may be formed in a self-aligned process, e.g., only on the in-situ doped regions.

The contacting of the silicide layer with metal structures may be performed, for example, according to a back end of line (BEOL) contacting scheme as known from the prior art.

In another embodiment of the method, the method comprises the steps:

optionally providing a wafer,
optionally providing a BOX layer,
optionally providing the BOX layer on top of the wafer,
optionally providing the waveguide on top of the BOX layer or on top of the wafer,
providing an epitaxial growth window defining a diode region,
providing the intrinsic region made of the second material in the diode region,
optionally providing a capping layer on top of the intrinsic region,
optionally removing parts of the capping layer outside of the diode region,
providing a first mask on top of a part of the diode region,
optionally removing, e.g., dry etching, part of the capping layer,
removing, e.g., dry etching, part of the intrinsic region in the diode region,
providing an insulator region made of a first type of insulator on top of the diode region such that the insulator region has at least two vertically extending contacting parts each in contact with a side of the intrinsic region such that the intrinsic region is sandwiched laterally between the vertically extending contacting parts of the insulator region made of the first type of insulator in the direction transverse to a direction of light propagation in the diode and two lateral parts each connected with one of the vertically extending contacting parts and extending away in lateral direction from the intrinsic region, providing insulator material made of a second type of insulator on top of the insulator region made of the first type of insulator, optionally removing parts of the insulator region made of the first type of insulator and insulator material made of the second type of insulator above the intrinsic region and above the vertically contacting parts of the insulator regions made of the first type of insulator which contact the intrinsic region, providing a second mask above the diode region such that a window is provided above one of the contacting parts of the insulator region made of the first type of insulator, removing the one of the contacting parts and optionally a part of the lateral part connected to the one of the contacting parts of the insulator region made of the first type of insulator, such that a first cavity in contact with the intrinsic region is formed, filling the first cavity with an in-situ doped region made of the first material doped with the first type of dopant or made of the third material doped with the second type of dopant in order to provide one of the p-doped and n-doped regions, optionally removing parts of the in-situ doped region outside of the diode region and above the first mask, providing a third mask above the diode region such that a window is provided above the other one of the contacting parts of the insulator regions made of the first type of insulator, removing the other one of the contacting parts and optionally a part of the lateral part connected to the other one of the contacting parts of the insulator region made of the first type of insulator, such that a second cavity in contact with the intrinsic region is formed, filling the second cavity with another in-situ doped region in order to provide the other one of the n-doped and p-doped regions, the other in-situ doped region being made of the third material doped with the second type of dopant or made of the first material doped with the first type of dopant, optionally removing parts of the other in-situ doped region outside of the diode region and above the first mask, optionally removing the insulator material made of the second type of insulator from the top of the in-situ doped regions, optionally providing a silicide layer on top of each of the in-situ doped regions, optionally contacting the silicide layers with metal structures.

The insulator regions made of the first type of insulator may be made, for example, from SiN. The insulator material made of the second type of insulator may be made, for example, from $SiO_2$.

Removing the one of the contacting parts and optionally a part of the lateral part connected to the one of the contacting parts of the insulator region made of the first type of insulator, such that the first cavity in contact with the intrinsic region is formed may be performed, for example, by wet etching. The first cavity may have, for example, a L-like form or a mirror-inverted L-like form.

Removing the other one of the contacting parts and optionally a part of the lateral part connected to the other one of the contacting parts of the insulator region made of the first type of insulator, such that the second cavity in contact with the intrinsic region is formed may be performed, for example, by wet etching. The second cavity may have, for example, a L-like form or a mirror-inverted L-like form.

Removing the insulator material made of the second type of insulator from the top of the in-situ doped regions may be performed, for example, by dry etching or wet etching.

The features and advantages of the diode and the method for producing the diode according to the invention shall now be described in more detail with reference to the attached Figures, in which:

BRIEF DESCRIPTION OF THE DRAWINGS

FIGS. 12-25 show, in respective cross-sectional views, subsequent processing stages in another embodiment of the method for producing the diode as shown in FIG. 3;

FIGS. 44-60 show, in respective cross-sectional views, subsequent processing stages in another embodiment of the method for producing an eighth embodiment of the diode as shown in FIG. 60;

FIGS. 61-66 show, in respective cross-sectional views, subsequent processing stages in another embodiment of the method for producing a ninth embodiment of the diode as shown in FIG. 66;

DETAILED DESCRIPTION

Figure 1:
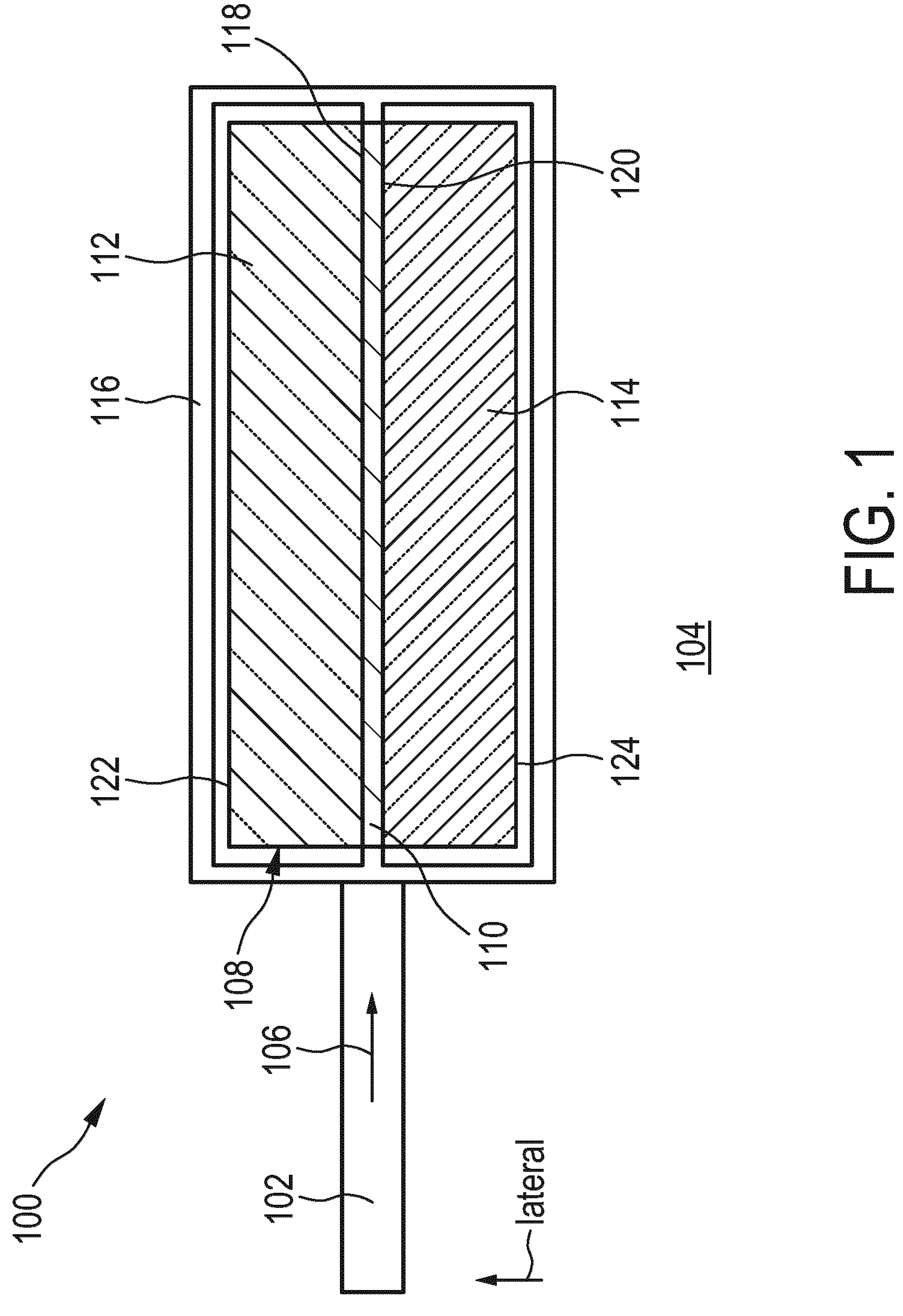
FIG. 1 shows, in a plan view, a processing stage of a first embodiment of a diode in form of a photodiode.

FIG. 1 shows a processing stage of a first embodiment of a diode 100 in form of a PIN photodiode. In this embodiment, a Si waveguide 102 is arranged on top of a BOX layer 104 made of $SiO_2$. Light propagates in a direction 106 of light propagation in the waveguide 102 into a diode region 108. In the diode region 108 a light-sensitive intrinsic Ge region 110 is sandwiched laterally between a p-doped Si region 112 and an n-doped Si region 114 in the direction transverse to the direction 106 of light propagation in the waveguide 102. In this embodiment, an additional $SiO_2$ insulator region 116 is arranged above the waveguide 102 outside of and surrounding the diode region 108 for forming an epitaxy window. In this embodiment, the intrinsic region 110 is in direct contact with the p-doped region 112 and the n-doped region 114, i.e., there is no intermediate region between them. The waveguide 102 is arranged below and in direct contact with the p-doped region 112, the intrinsic region 110, and the n-doped region 114. In this embodiment, the intrinsic region 110 is not doped, i.e., the diode 100 is produced such that the intrinsic region 110 is not doped when the diode 100 is produced.

In this embodiment, the waveguide 102 extends beyond lateral ends 118 and 120 of the intrinsic region 110 in lateral direction. In other embodiments, the waveguide may extend to the lateral ends of the intrinsic region. In yet other embodiments, the waveguide may even extend beyond the p-doped region, the intrinsic region, and the n-doped region in lateral direction, e.g., at least 100 nm, or even more than 500 nm beyond lateral ends 122 and 124 of the p-doped and n-doped regions.

A maximal lateral extension between the two lateral ends 118 and 120 of the intrinsic region, i.e., its lateral width, is 200 nm. In other embodiments, the intrinsic region may have a maximal lateral extension between its two lateral ends of equal to or below 400 nm.

In other embodiments, the p-doped region may be made of a first material doped with a first type of dopant and the n-doped region may be made of a third material doped with a second type of dopant. The first material may include Si or SiGe. The third material may include Si or SiGe. The first material and the third material may have an identical or different material composition. The intrinsic region may be made of a second material different to the first material and/or the third material. The second material may include Ge, GeSn, or SiGe.

Figure 2:
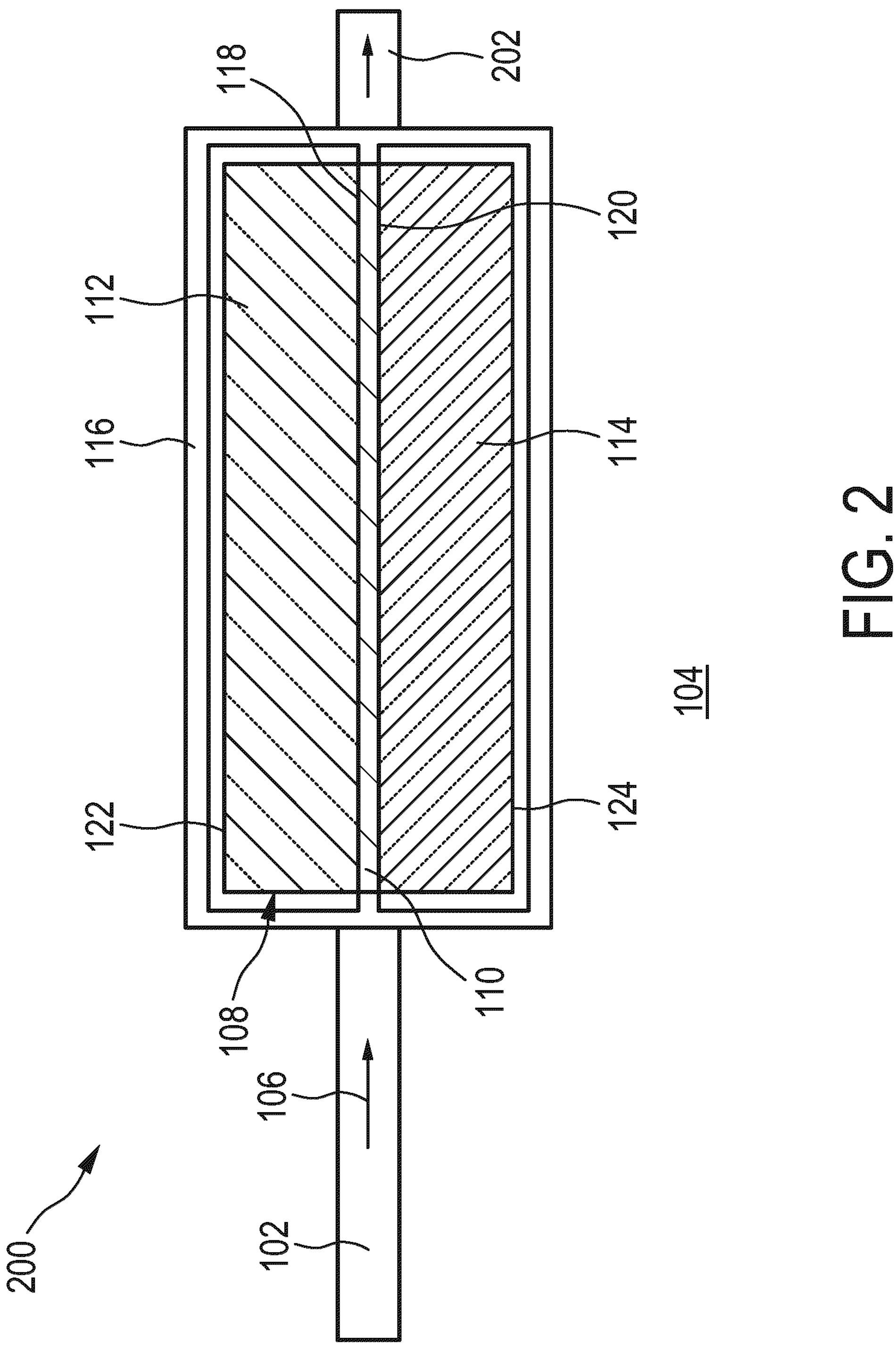
FIG. 2 shows, in a plan view, a processing stage of a second embodiment of a diode in form of an electro-absorption modulator.

FIG. 2 shows a processing stage of a second embodiment of a diode 200 in form of an electro-absorption modulator. This embodiment is similar to the diode presented in FIG. 1, except that it has an additional output Si waveguide 202. In other embodiments, the intrinsic region may be made of, for example, SiGe. Adjusting a ratio between Si and Ge allows to adjust the bandgap and thus may allow to provide an improved electro-absorption modulator for specific wavelengths. In this embodiment, waveguide 102 serves as input waveguide to the diode region 108. The light signal, e.g., a laser beam, may be processed, e.g., by modulating an intensity of the laser beam, in the diode region 108 and a processed light signal may be output via the waveguide 202.

Figure 3:
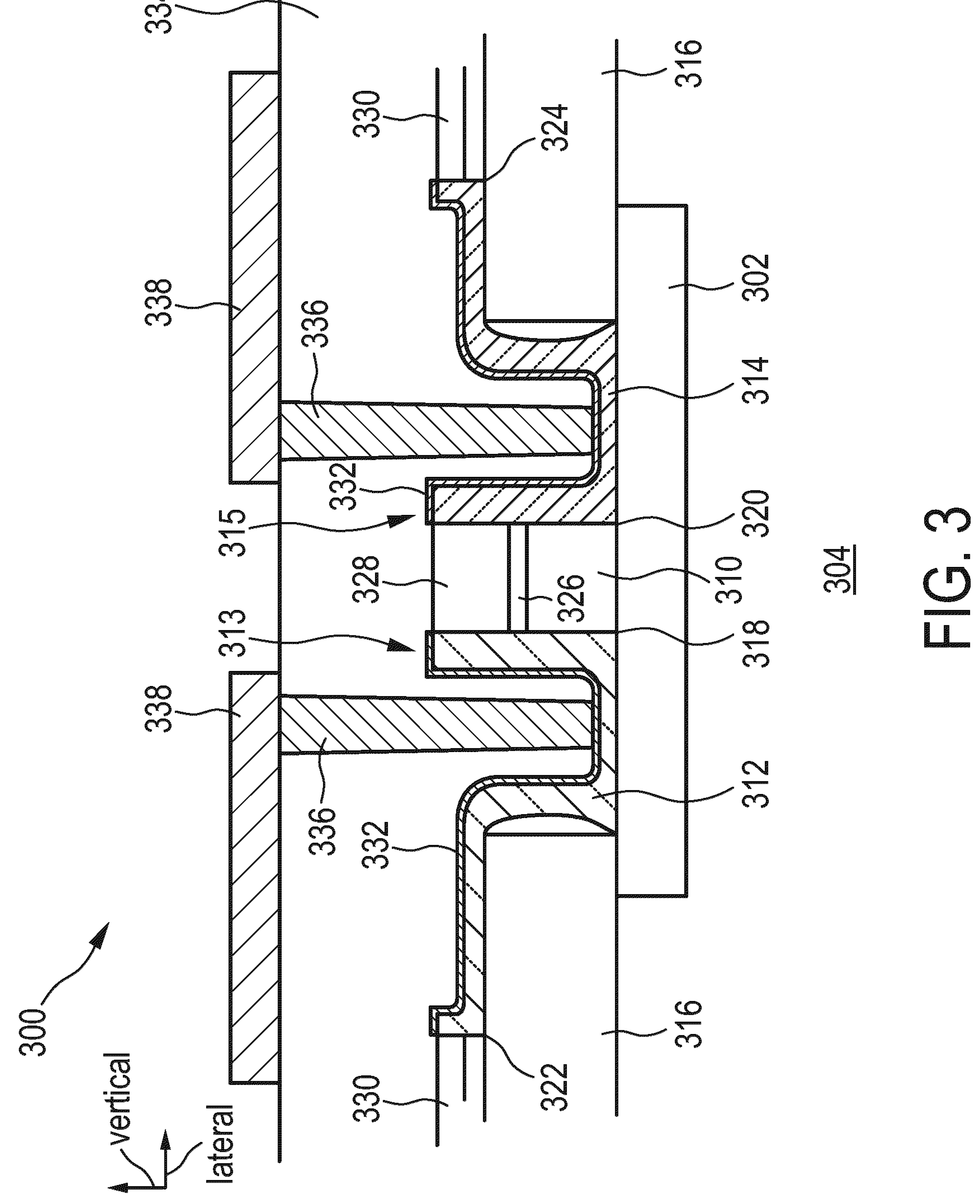
FIG. 3 shows, in a cross-sectional view, a third embodiment of the diode.

FIG. 3 shows a third embodiment of a diode 300 in form of another PIN photodiode. Equivalent reference signs are used for the embodiments of the diodes, i.e., equivalent features have equivalent reference signs with an adjusted hundreds digit, e.g., intrinsic region has the reference sign 110 for the first embodiment and 310 for the third embodiment, and so forth.

The diode 300 comprises a Si waveguide 302 arranged on a $SiO_2$ BOX layer 304, a p-doped Si region 312, an intrinsic Ge region 310, an n-doped Si region 314, insulator regions 316, a Si capping layer 326, an $SiO_2$ insulator layer 328, $SiO_2$ insulator layers 330, $CoSi_2$ metal silicide layers 332, $SiO_2$ insulator layer 334, W metal connectors 336, and AlCu metal electrodes 338. In other embodiments, for example, the waveguide may be made of SiGe, the doped regions may be made of SiGe, the intrinsic region may be made of GeSn or SiGe, the metal silicide layers may be made of NiSi, the metal connectors may be made of a different material, and/or the metal electrodes may be made of a different material.

In this embodiment, the p-doped region 312 and the n-doped region 314 have a U-like form. The p-doped region 312 and the n-doped region 314 are in-situ doped, i.e., the doped regions 312 and 314 are produced using in-situ doped material. This allows to avoid an ion implantation step as well as a thermal activation step for the dopants. The ion implantation step may result in unintentionally doping the intrinsic region which would reduce speed of the diode due to a negative impact of minority carrier diffusion. The thermal activation step may result in diffusion of more dopants into the intrinsic region. Using in-situ doped regions thus may reduce doping concentration in the intrinsic region. Using in-situ doped material thus allows to produce the diode such that the intrinsic region is not doped during its production. In this embodiment, the intrinsic region is not doped.

In this embodiment, the BOX layer 304 is arranged on a Si wafer (not shown). The waveguide 302 is arranged on and embedded in the BOX layer 304. The p-doped region 312, the intrinsic region 310, and the n-doped region 314 are arranged on top of the waveguide 302 and directly contact the waveguide 302. Some parts of the doped regions 312 and 314 do not directly contact the waveguide 302, in this embodiment. The waveguide 302 extends beyond the parts of the p-doped region 312, the intrinsic region 310, and the n-doped region 314 in lateral direction which directly contact the waveguide 302.

The insulator regions 316 are arranged above the waveguide 302. The capping layer 326 is arranged on top of a top surface of the intrinsic region 310. The intrinsic region 310 has a planar bottom surface and a planar top surface. In other embodiments, the surfaces, e.g., the top surface, may also have another form, e.g., a curved form. The capping layer 326 is arranged on top of the planar top surface of the intrinsic region 310. The insulator layer 328 is arranged on top of the capping layer 326. Vertical surfaces of the intrinsic region 310 contacting the p-doped region 312 and the n-doped region 314 are perpendicular to the planar bottom surface in this embodiment. In other embodiments, they may have a convex or concave form, such that the intrinsic region has a biconvex or biconcave form.

A respective contacting part 313 and 315 of each of the p-doped region 312 and the n-doped region 314 which contacts the intrinsic region 310 extends vertically beyond a vertically highest point of the intrinsic region 310. In this embodiment, the contacting parts 313 and 315 of the p-doped and n-doped regions 312 and 314 further extend vertically beyond the capping layer 326. The intrinsic region 310 has a maximal lateral extension between its lateral ends 318 and 320, i.e., a lateral width, of 300 nm. In other embodiments, it may also have a lateral width of equal to or below 400 nm, such as 200 nm or 100 nm. The p-doped and n-doped regions 312 and 314 laterally extend to the insulator layers 330 ending at their lateral ends 322 and 324.

The silicide layers 332 are arranged on top surfaces of the p-doped region 312 and the n-doped region 314. Furthermore, the vertically extending metal connectors 336 made of tungsten, connect the silicide layers 332 to metal structures in form of AlCu metal electrodes 338 which are arranged in a first horizontal structured metal plane. This allows applying an operating voltage to the diode 300. Using silicide layers allows improving contact with the vertically extending metal connectors. Alternatively, a higher doping concentration may be provided, for example, in the doped regions which are connected with the vertically extending metal connectors.

Figure 4:
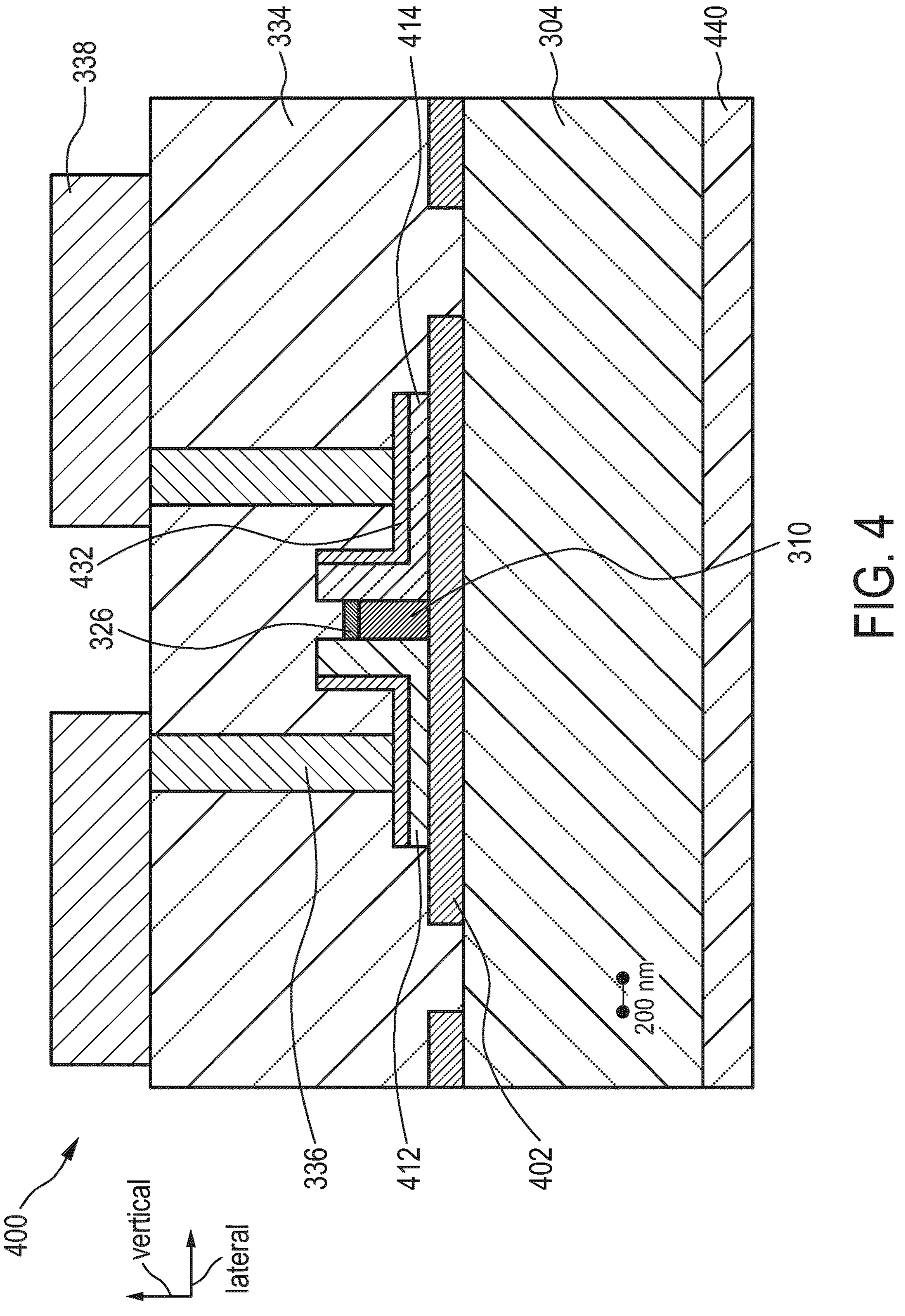
FIG. 4 shows, in a cross-sectional view, a fourth embodiment of the diode.

FIG. 4 shows a fourth embodiment of the diode 400 in form of another photodiode. The photodiode is similar to the third embodiment of the diode 300. Identical reference numerals are used for identical features. In contrast to the diode 300 the BOX layer 304 is shown to be arranged on a Si wafer 440. Furthermore, Si waveguide 402 extends laterally beyond the p-doped region 412, the intrinsic region 310, and the n-doped region 414. This is a consequence of the doped region having a L-like form and respectively mirror-inverted L-like form. Furthermore, another consequence is that silicide layers 412, e.g., made of $CoSi_2$ or NiSi, have respective L-like and mirror-inverted L-like forms. In this embodiment, the intrinsic region 310 has a lateral width of 200 nm.

The previously described diodes may be produced by a method including the steps:

providing a p-doped region, providing an n-doped region, providing a light-sensitive intrinsic region sandwiched laterally between the p-doped region and the n-doped region in a direction transverse to a direction of light propagation in the diode. The intrinsic region is provided with a maximal lateral extension between two lateral ends of the intrinsic region of equal to or below 400 nm, and when producing the diode, the intrinsic region is not doped.

How this may be performed in detail is described in the following with respect to the FIGS. 1 and 5-11 as well as with respect to the FIGS. 3 and 12-25.

Figures 5, 6, 7, 8:
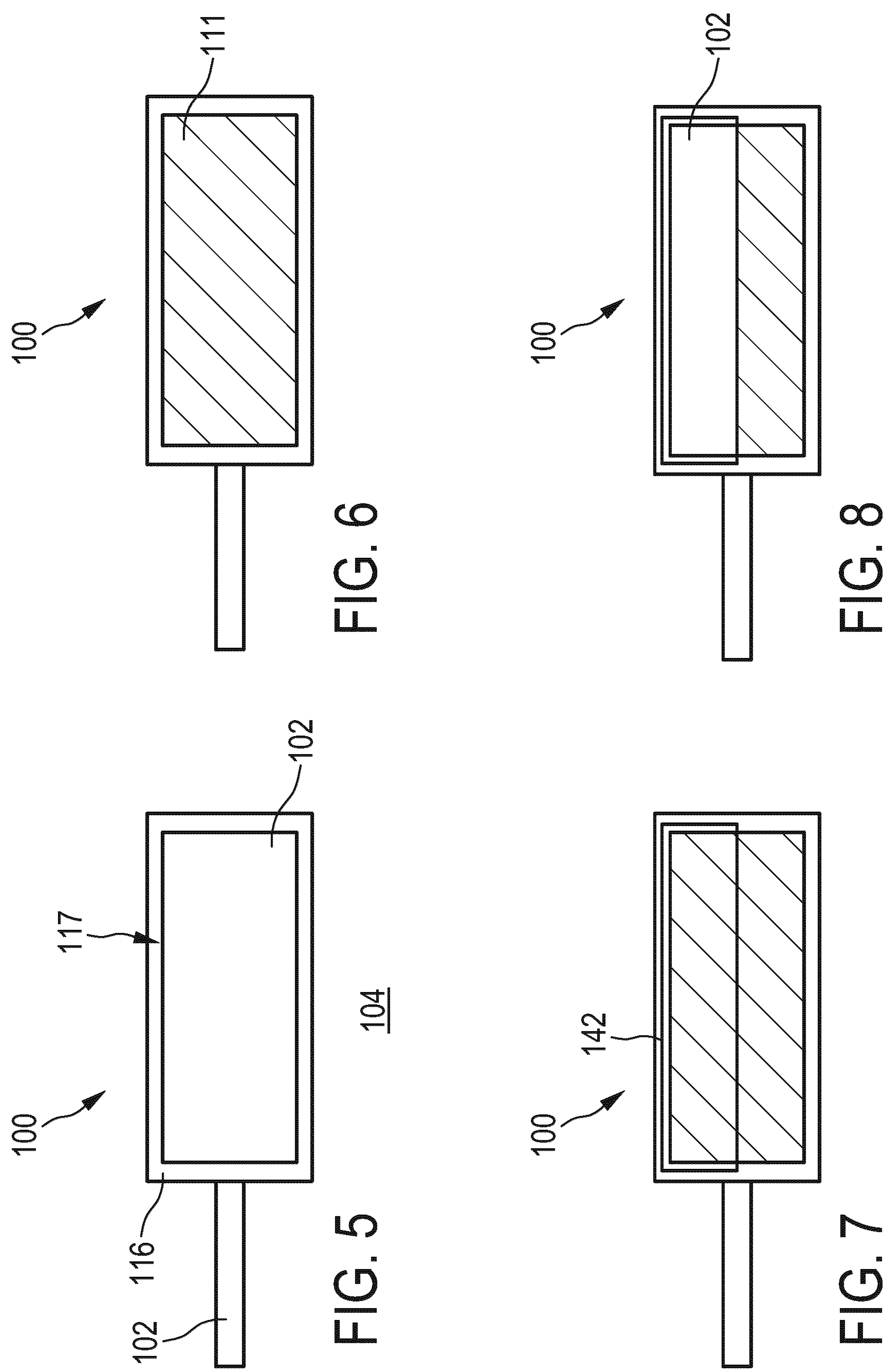
FIGS. 5-11 show, in respective plan views, subsequent processing stages in an embodiment of a method for producing the photodiode of FIG. 1.

FIG. 5 shows a state of a region in which the diode 100 is produced. The waveguide 102 is provided on the BOX layer 104. Furthermore, an epitaxy window 117 is provided framed by insulator layer 116 provided above the waveguide 102. In the epitaxy window 117 a planar Si surface is provided for epitaxially growing the Ge region 110. A Ge layer 111 is selectively, epitaxially grown on the planar Si surface in the epitaxy window 117 as shown in FIG. 6.

In FIG. 7 a $SiO_2$ hardmask 142 is applied for providing a window for structuring the Ge inside of the window. In this embodiment, dry etching, such as RIE, is used for structuring. FIG. 8 shows a state in which the Ge is locally removed inside of the window and the dry etching is stopped on the Si surface of the waveguide 102.

Figures 9, 10, 11:
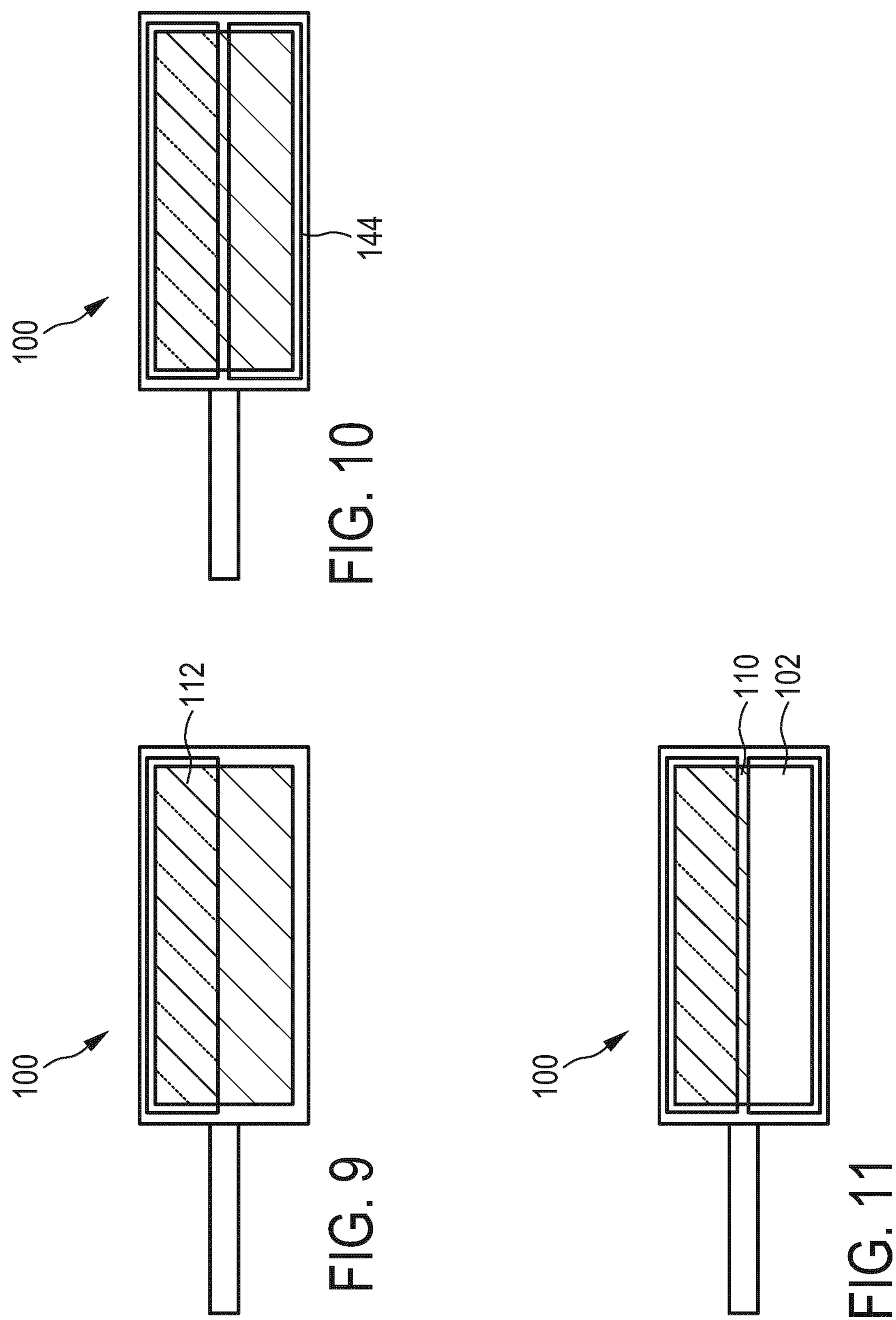

FIG. 9 shows epitaxial deposition of in-situ doped Si doped with a first type of dopant and subsequently removing the in-situ doped Si outside of the window by CMP in order to provide the in-situ p-doped region 112. The first type of dopant is Boron. In other embodiments, it may be another element resulting in p-doping.

In FIG. 10 another $SiO_2$ hardmask 144 is applied for providing a window for structuring the Ge inside of the window on the other lateral side of the to be produced intrisic Ge region while the previously provided p-doped region 112 is protected by $SiO_2$. The structuring is again performed by dry etching, e.g., RIE. FIG. 11 shows a state in which the Ge is locally removed inside of the window and the dry etching stops on the Si surface of the waveguide 102.

FIG. 1 shows epitaxial deposition of in-situ doped Si doped with a second type of dopant and subsequently removing the in-situ doped Si outside of the window by CMP in order to provide the in-situ n-doped region 114. The second type of dopant is phosphorus. In other embodiments, it may be another element resulting in n-doping. This allows to provide the intrinsic region 110 sandwiched laterally between the doped regions 112 and 114 and without doping the intrinsic region 110. Therefore, the intrinsic region 110 is not doped during producing the diode. The intrinsic region can thus be made from pure material with a low impurity concentration or dopant concentration.

The diode 100 may further be contacted, e.g., as shown for the diode 300 of FIG. 3 and described in the following with respect to the production process of diode 300 in FIGS. 12 to 25.

Figure 12:
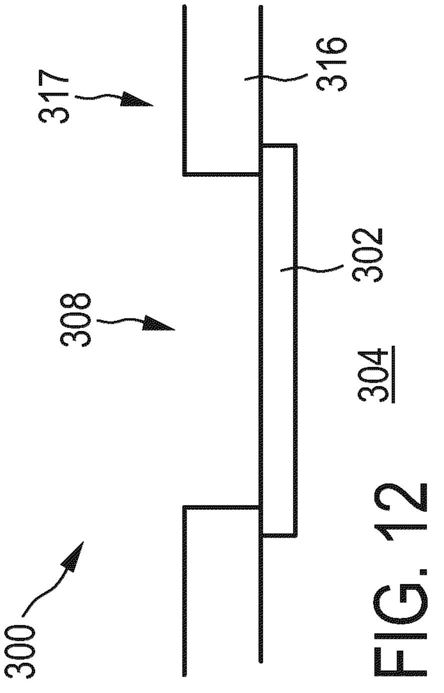

FIG. 12 shows a state of a region in which the diode 300 is produced, similar to the state shown in FIG. 5. The waveguide 302 is arranged on and embedded in the BOX layer 304 and an epitaxy window 317 is formed by insulator layer 316. The epitaxy window 317 defines a diode region 308.

Figure 13:
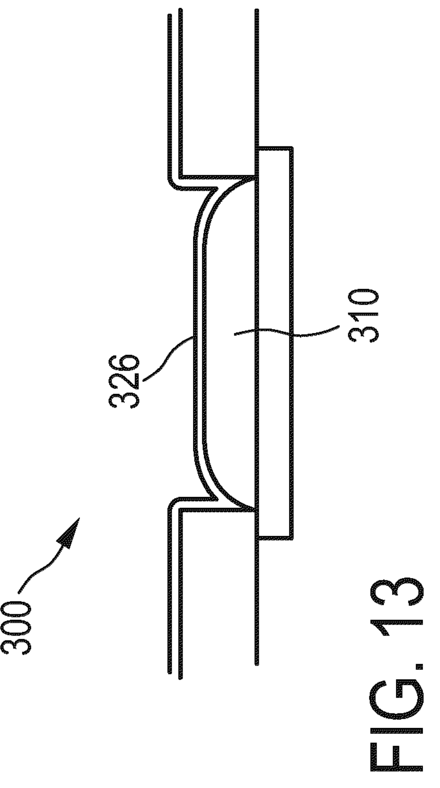

FIG. 13 shows a process stage in the diode production process after selective, epitaxial growth of the intrinsic Ge region 310 on the waveguide 302. Facet formation on the upper side of Ge region 310, typical for selective Ge growth on (100) oriented Si, is indicated schematically. As also illustrated in FIG. 13, the capping layer 326 is optionally selectively deposited immediately after selective growth of the intrinsic region 310. Optionally the capping layer 326 outside of the epitaxy window 317 formed by insulator layer 316 may be removed by CMP.

Figure 15:
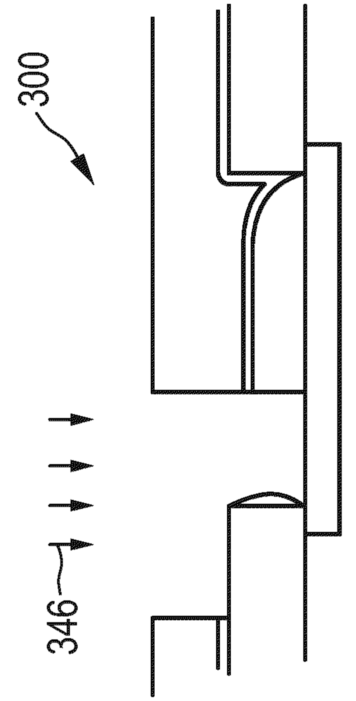
Figure 14:
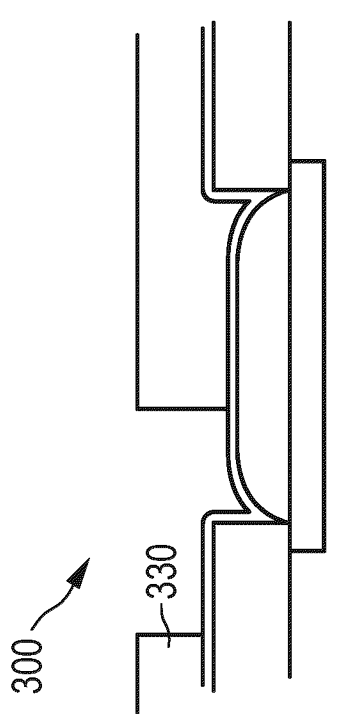

FIG. 14 shows applying a $SiO_2$ hardmask 330 above the intrinsic region 310. The hardmask 330 covers a part of the intrinsic region 310 and leaves another part uncovered. In FIG. 15 the intrinsic region 310 and optionally the capping layer 326 is structured by removing the uncovered part of the intrinsic region 310 by dry etching 346, such as RIE. This produces a vertical surface of the intrinsic region 310. The vertical surface 310 is perpendicular to a planar bottom surface of the intrinsic region 310. In other embodiments, it may also have a concave or convex form.

Figure 16:
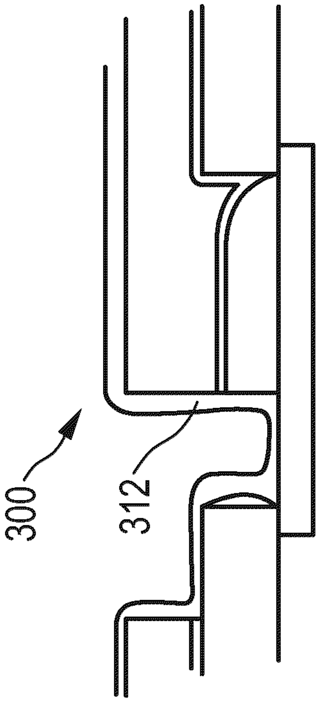

FIG. 16 shows epitaxy of in-situ doped Si doped with a first type of dopant onto the structure obtained from the previous processing step in order to form the p-doped region 312. In this embodiment, the in-situ doped Si is doped with boron atoms, i.e., the first type of dopant is boron, in other embodiments it may also be doped with another species of atoms which provides a p-doping. Instead of providing a p-doped region at first, the n-doped region may be provided at first.

Figure 17:
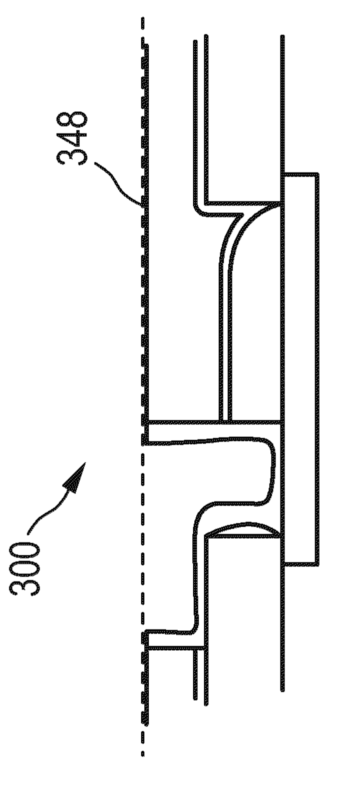

Subsequently, as shown in FIG. 17, CMP is performed along line 348 in order to remove the in-situ doped Si outside the epitaxy window 317. In other embodiments, CMP may include using a stopping layer, e.g., made of SiN.

Figure 18:
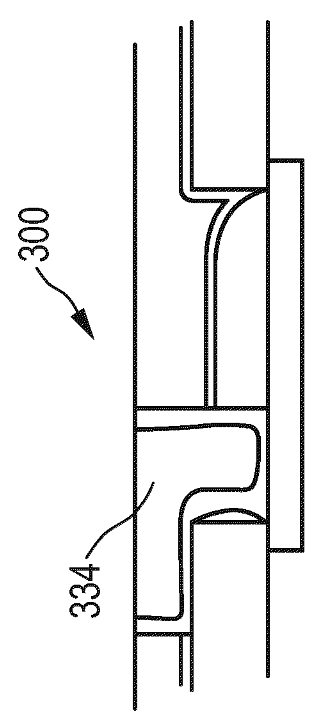

In FIG. 18 the gap above the p-doped region 312 is filled with an insulator layer 334 made of $SiO_2$ and another CMP step is performed in order to remove excess $SiO_2$ outside the epitaxy window. In other embodiments, $SiO_2$ may be applied before the in-situ doped Si is removed and the CMP step may remove both the Si and $SiO_2$ in this case.

Figure 19:
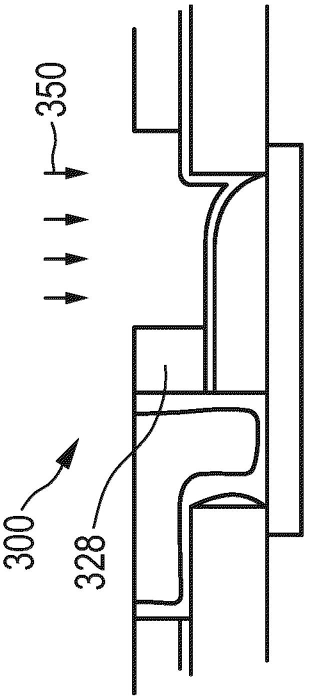

FIG. 19 shows opening of the hardmask 330 on the other lateral side of the diode 300 by lithography and dry etching 350 such that the $SiO_2$ is removed. This provides an insulator layer 328 above the intrinsic region 310.

FIG. 20 shows performing structuring the intrinsic region 310 by removing a part of the intrinsic region 310 by dry etching, such as RIE, in the region of the removed hard mask 330. The dry etching stops on the surface of the waveguide 302.

FIG. 21 shows epitaxy of in-situ doped Si doped with a second type of dopant onto the structure obtained from the previous processing step in order to form the n-doped region 314. In this embodiment, the in-situ doped Si is doped with phosphorus atoms, i.e., the second type of dopant is phosphorus. In other embodiments it may also be doped with another species of atoms which provides an n-doping, e.g., arsenic.

Subsequently, as shown in FIG. 22, CMP is performed along line 348 in order to remove the in-situ doped Si outside the epitaxy window. In other embodiments, CMP may include using a stopping layer, e.g., made of SiN. This allows providing the intrinsic region 310 sandwiched laterally between the p-doped region 312 and the n-doped region 314. Since in-situ doped Si is used for providing the doped regions, the intrinsic region 310 is not doped when producing the diode 300. The gap above the n-doped region 314 may be filled with insulator layer 334 made of $SiO_2$ before performing CMP or alternatively $SiO_2$ may be applied subsequently followed by another CMP step for removing excess $SiO_2$ outside the epitaxy window.

In FIG. 23 the $SiO_2$ is removed by lithography and dry etching 350 for preparing the doped regions 312 and 314 for silicidation. This is optional.

Figure 24:
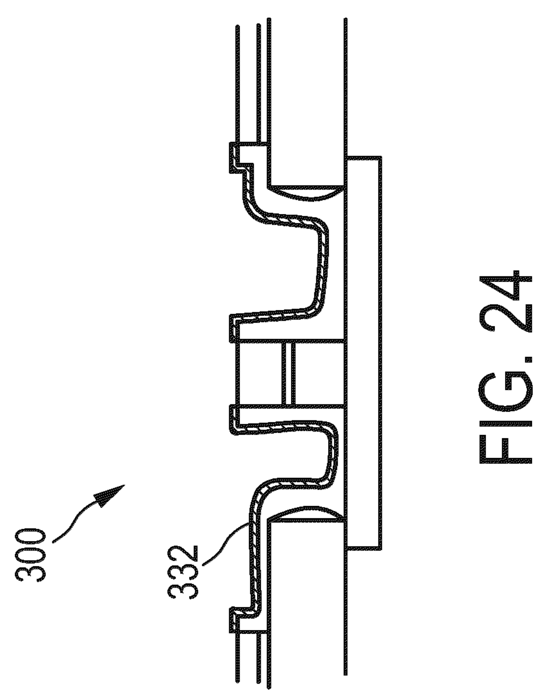

FIG. 24 shows formation of the silicide layers 332 on the top surface of the p-doped region 312 and the n-doped region 314. Silicide layers 332 serve to keep series resistance of the diode 300 low, which has beneficial effects with regard to the bandwidth that can be achieved.

Figure 25:
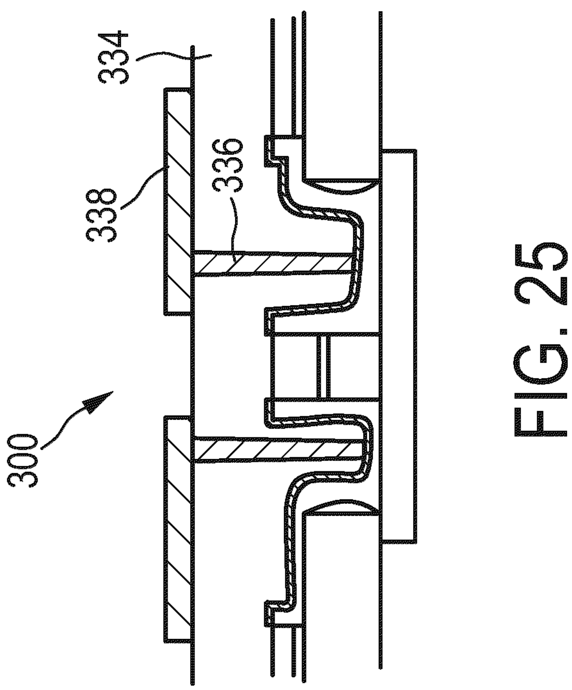

In FIG. 25 contacting of the silicide layers 332 with the metal structure in form of AlCu metal electrodes 338 which are arranged in the first horizontal structured metal plane. The W metal connectors 336 connect the silicide layers 336 with the AlCu metal electrodes 338 such that an operation voltage can be applied to the diode 300. Additionally an insulator layer 334 is provided between the metal electrodes 338 and the structure laying below them. The contacting may be performed, for example, according to a BEOL contacting scheme as known from the prior art.

This allows providing a diode with superior properties due to the undoped intrinsic region being in contact with and sandwiched laterally between the p-doped region and the n-doped region in the direction transverse to the direction of light propagation in the waveguide, respectively diode.

Figure 26:
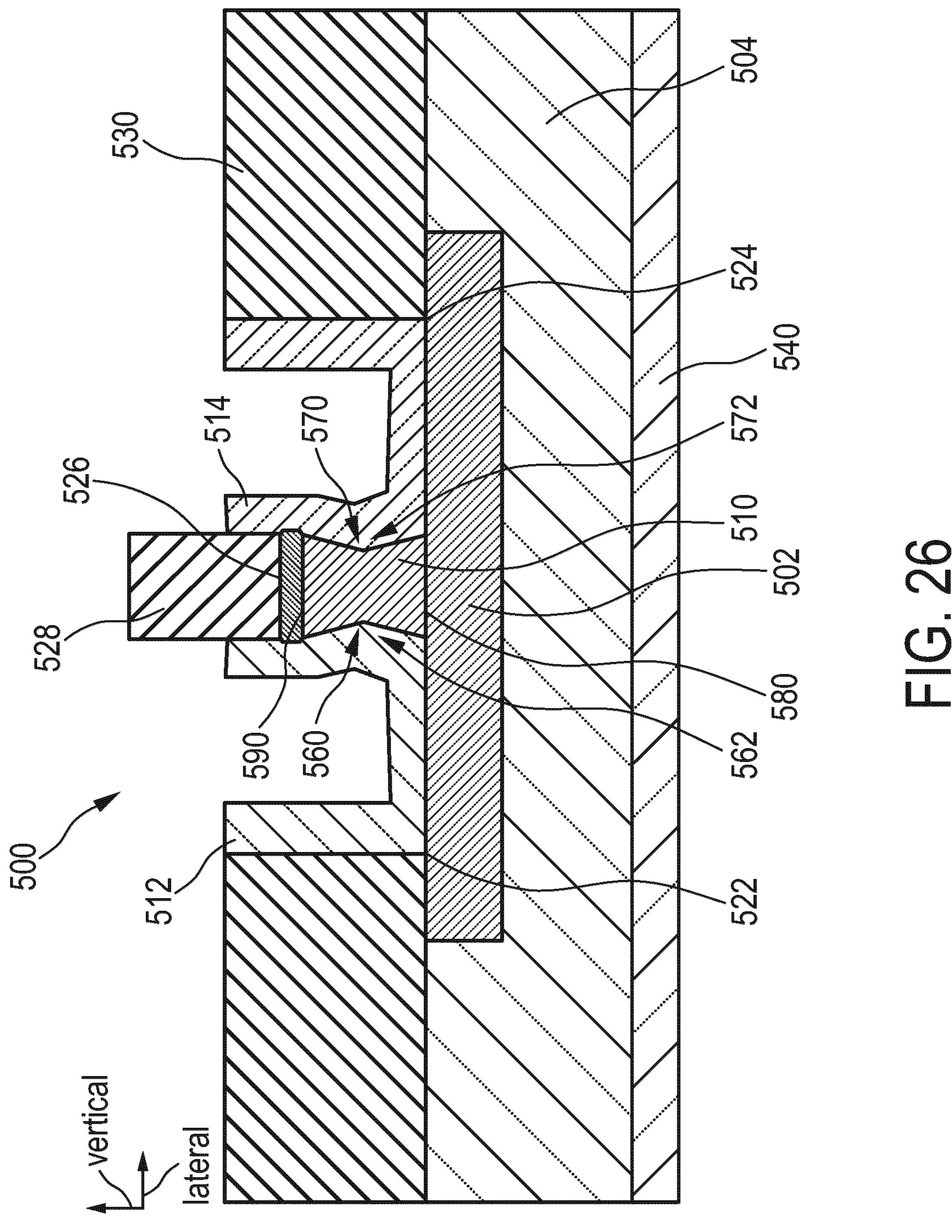
FIG. 26 shows in a cross-sectional view, a fifth embodiment of the diode.

FIG. 26 shows a fifth embodiment of the diode 500 in form of yet another photodiode. The diode 500 is similar to the previously described diodes. Diode 500 includes a Si waveguide 502 arranged on a $SiO_2$ BOX layer 504 which is arranged on a Si wafer 540. The diode 500 furthermore includes a p-doped Si region 512, an intrinsic Ge region 510, an n-doped Si region 514, a Si capping layer 526, and insulator layers 528 and 530.

In this embodiment, the intrinsic region 510 has vertical surfaces 560 and 570 with a concave form and material of the p-doped region 512 and the n-doped region 514 extends into recesses 562 and 572 caused by the concave form of the intrinsic region 510. In other embodiments, the vertical surfaces of the intrinsic region may also be convex and a respective surface of the p-doped region and the n-doped region contacting the convex vertical surface of the intrinsic region may have a positively contacting concave form.

Furthermore, in this embodiment, the waveguide 502 extends beyond the p-doped region 512, the intrinsic region 510, and the n-doped region 514 in lateral direction. The waveguide may extend at least 100 nm, such as more than 500 nm, in lateral direction beyond a lateral end 522 of the p-doped region 512 and at least 100 nm, such as more than 500 nm, in lateral direction beyond a lateral end 524 of the n-doped region 514.

In this embodiment, the intrinsic region 510 has a planar bottom surface 580 and a planar top surface 590.

A metal silicide layer may be applied on top of the doped regions and metal connectors may be connected to the metal silicide layer in order to contact them with a metal structure, e.g., metal electrodes (not shown).

Figure 27:
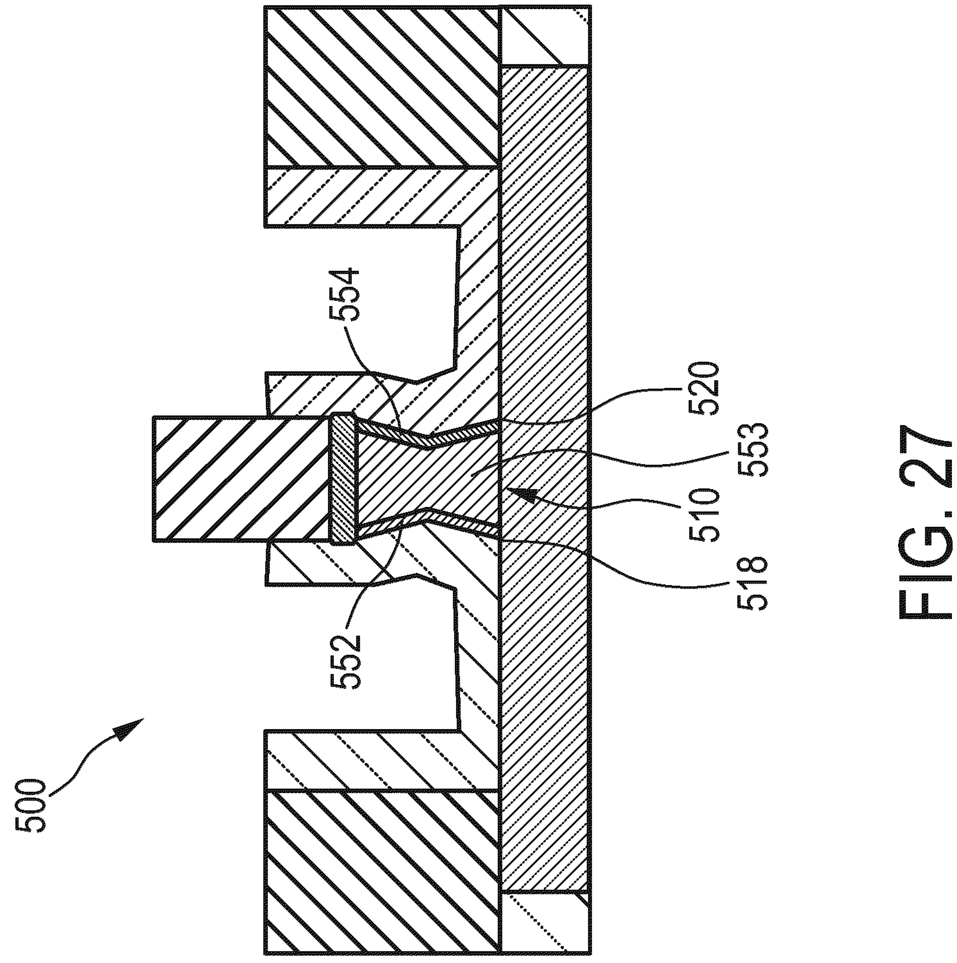
FIG. 27 shows in a cross-sectional view, a detail of the fifth embodiment of the diode.

FIG. 27 shows a detail of diode 500 with contacting part 552, central part 553, and contacting part 554. The intrinsic region 510 has a maximal lateral extension between its two lateral ends 518 and 520 of 200 nm in this embodiment. In other embodiments, it may also have a maximal lateral extension of equal to or below 400 nm, such as equal to or below 300 nm, or equal to or below 200 nm, e.g., between 200 nm and 300 nm, or between 100 nm and 300 nm.

In this embodiment, the central part 553 has an impurity concentration of $10^{16}$ atoms/$cm^3$. In other embodiments, the central part may also have a lower impurity concentration, e.g., below $10^{15}$ atoms/$cm^3$ or below $10^{14}$ atoms/$cm^3$.

The contacting parts 552 and 554 of the intrinsic region 510 are parts of the intrinsic region 510 that are in direct contact with the p-doped region 512 and the n-doped region 514. The contacting parts 552 and 554 may have a respective lateral extension of up to 70 nm for a maximal lateral extension of 200 nm of the intrinsic region 510. The contacting parts 552 and 554 include a higher doping concentration than the central part 553 of the intrinsic region 510 due to dopant diffusion from the p-doped and n-doped regions 512 and 514, such that the contacting parts 552 and 554 may have a higher doping concentration than $10^{16}$ atoms/$cm^3$, e.g., a doping concentration of between $10^{16}$ atoms/$cm^3$ and $10^{18}$ atoms/$cm^3$. In other embodiments, the doping concentration in the contacting parts of the intrinsic region may also be less than $10^{16}$ atoms/$cm^3$.

Figure 28:
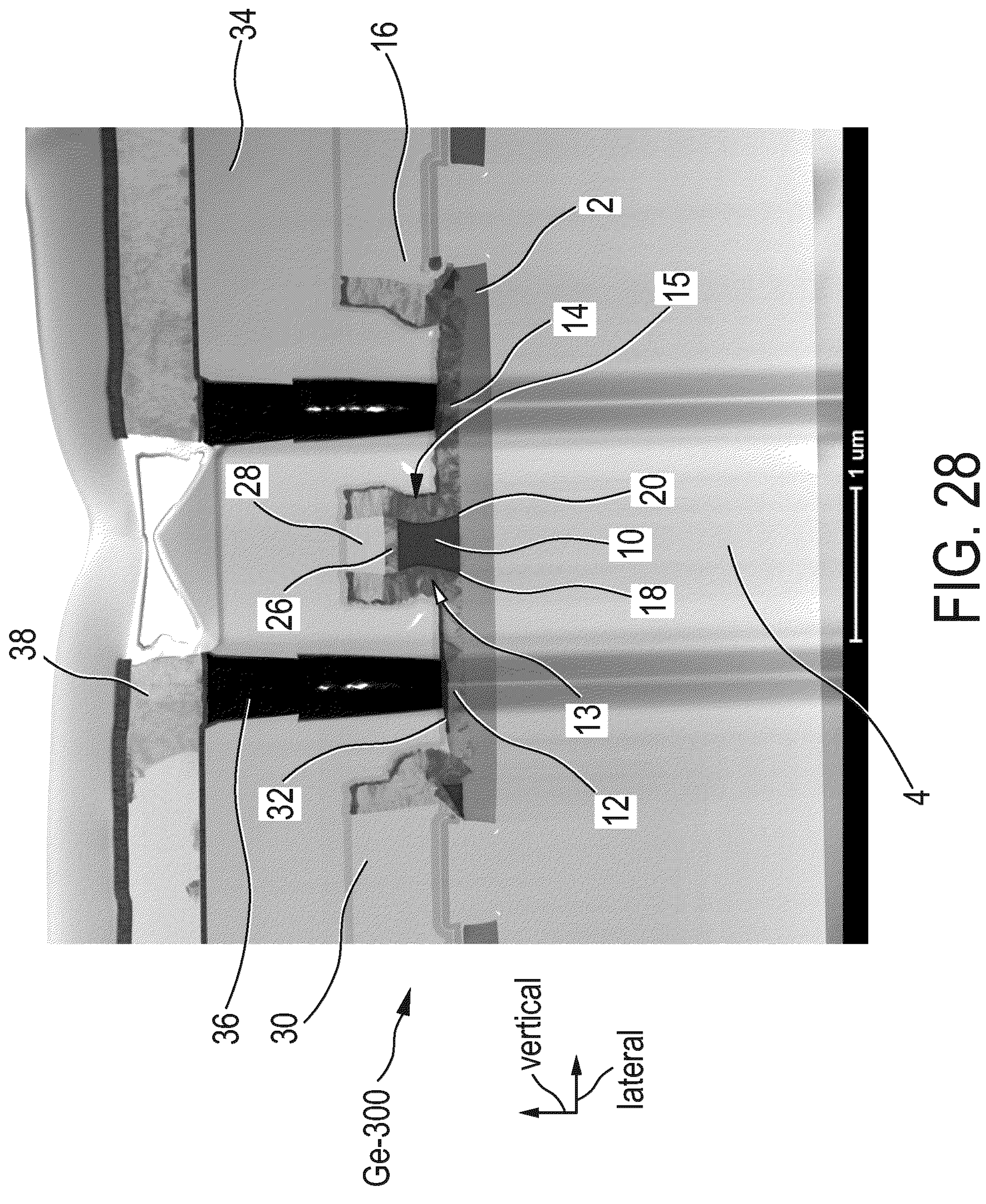
FIG. 28 shows an electron microscopic cross-sectional view of a diode similar in structure to the embodiment shown schematically in FIG. 3 with a convex intrinsic region.

FIG. 28 shows an electron microscopic cross-sectional view of a PIN diode having a similar structure as the embodiment shown schematically in FIG. 3 with vertical surfaces with concave form such that intrinsic region 10 has a biconcave form. Similar to the embodiment of the diode shown in FIG. 3, diode Ge-300 includes a Si waveguide 2 arranged on a $SiO_2$ BOX layer 4, a p-doped Si region 12, the intrinsic Ge region 10, an n-doped Si region 14, insulator regions 16, a Si capping layer 26, an $SiO_2$ insulator layer 28, $SiO_2$ insulator layers 30, $CoSi_2$ metal silicide layers 32, $SiO_2$ insulator layer 34, W metal connectors 36, and AlCu metal electrodes 38. Respective contacting parts 13 of the p-doped region 12 and 15 of the n-doped region 14 are in contact with the intrinsic region 10, such that the intrinsic region 10 is sandwiched laterally between the p-doped region 12 and the n-doped region 14 in order to form a PIN-diode. The intrinsic region 10 in this embodiment has a maximal lateral extension between its lateral ends 18 and 20 of 300 nm, i.e., the lateral width is 300 nm. While the doped regions extend behind the metal connectors 36, the further extending parts do not significantly contribute to the function of the diode Ge-300.

Figure 29:
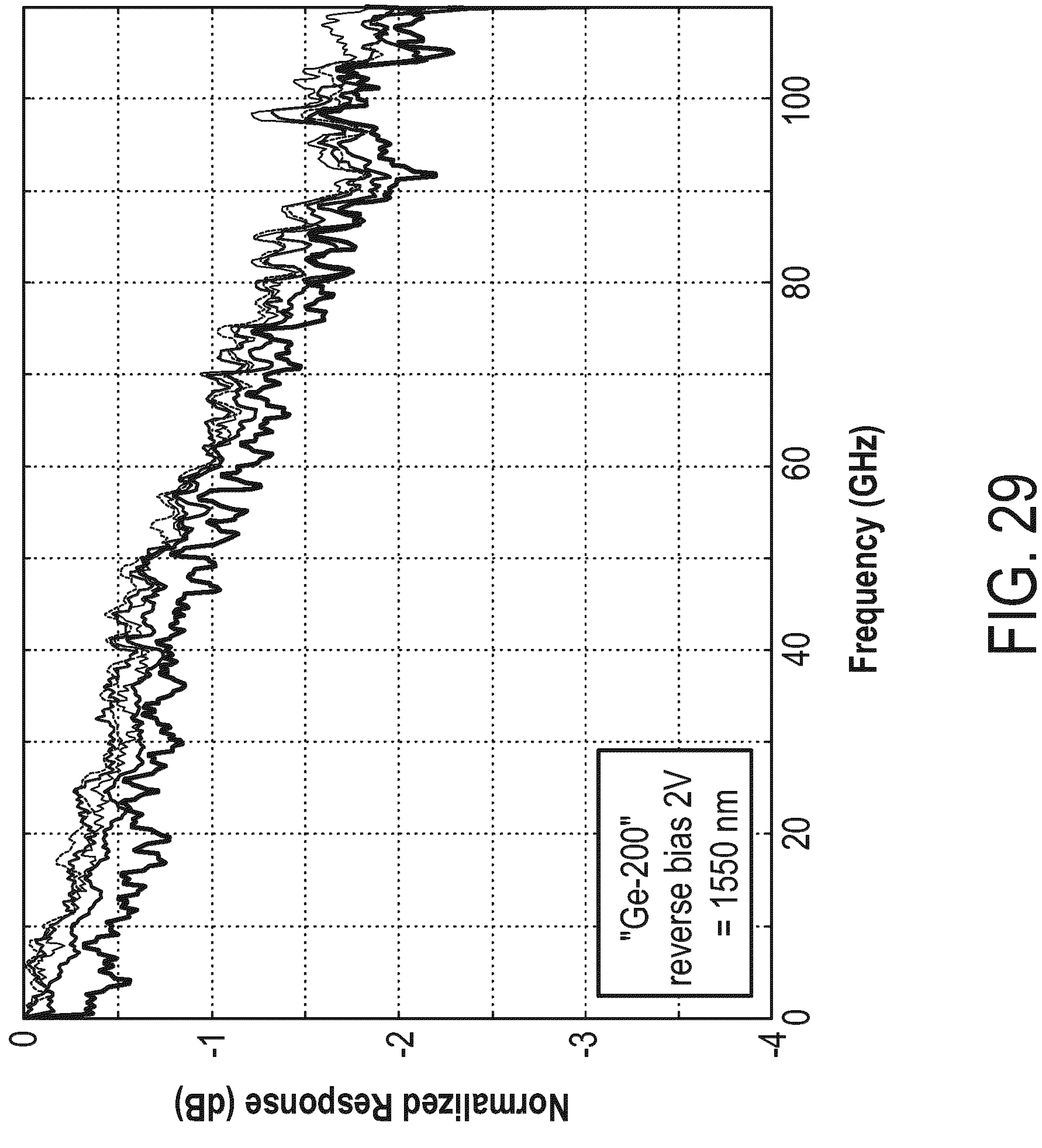
FIGS. 29-31 show measurement data obtained from the diode shown in FIG. 28 and a diode with a similar structure.
Figure 30:
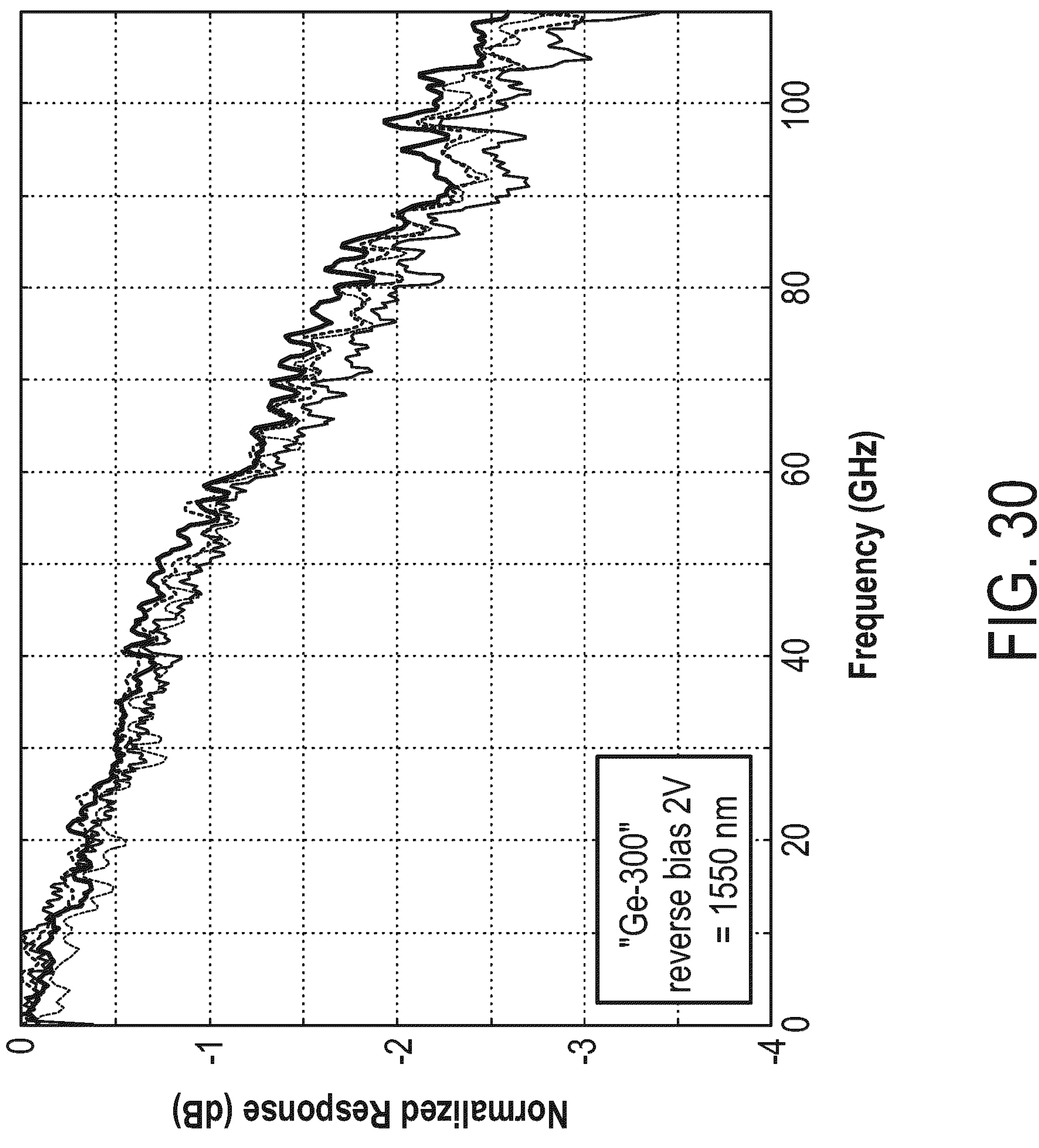
Figure 31:
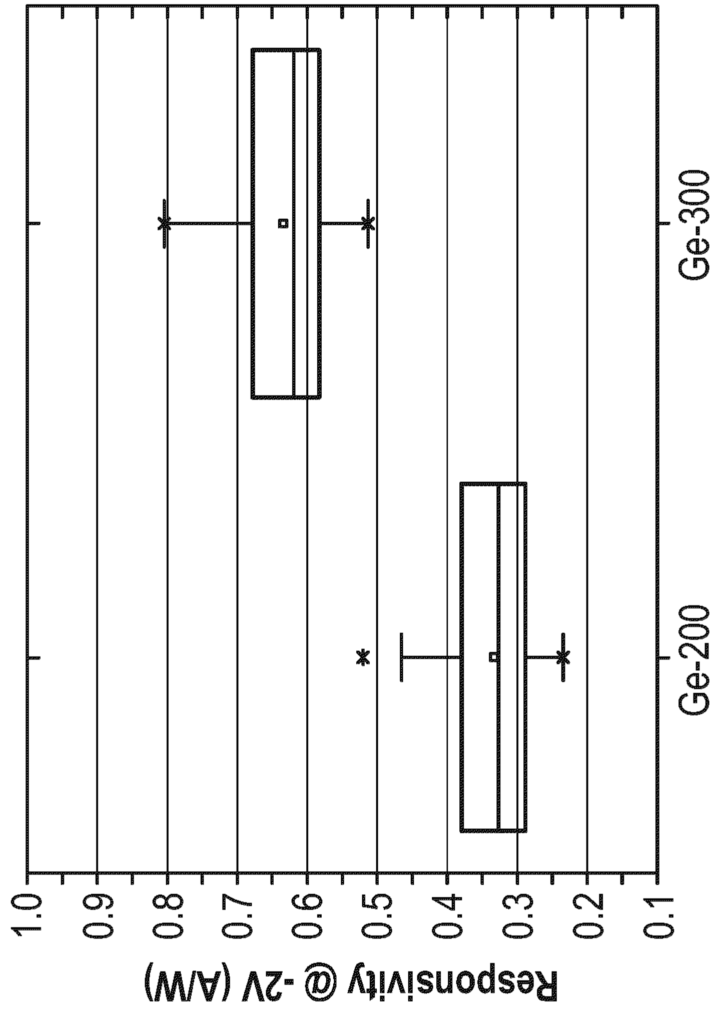

FIGS. 29 to 31 show measurement data recorded on the diode structure shown in FIG. 28, as well as for a diode Ge-200 with lateral width of 200 nm. FIG. 29 indicates a bandwidth significantly higher than shown by diodes known from the prior art, i.e., much more than 110 GHz at −3 dB at 2 V reverse bias. FIG. 30 shows that the bandwidth for diode Ge-300 is also much higher, i.e., higher than 110 GHz at −3 dB at 2 V reverse bias.

FIG. 31 indicates a reasonable responsivity of the diodes Ge-200 and Ge-300 with more than 0.3 A/W, namely between 0.3 to 0.4 A/W and respectively, 0.6 to 0.65 A/W.

Furthermore, a reasonable dark-current has been measured for the diodes Ge-200 and Ge-300 with 300-400 nA at −2V.

Figure 32:
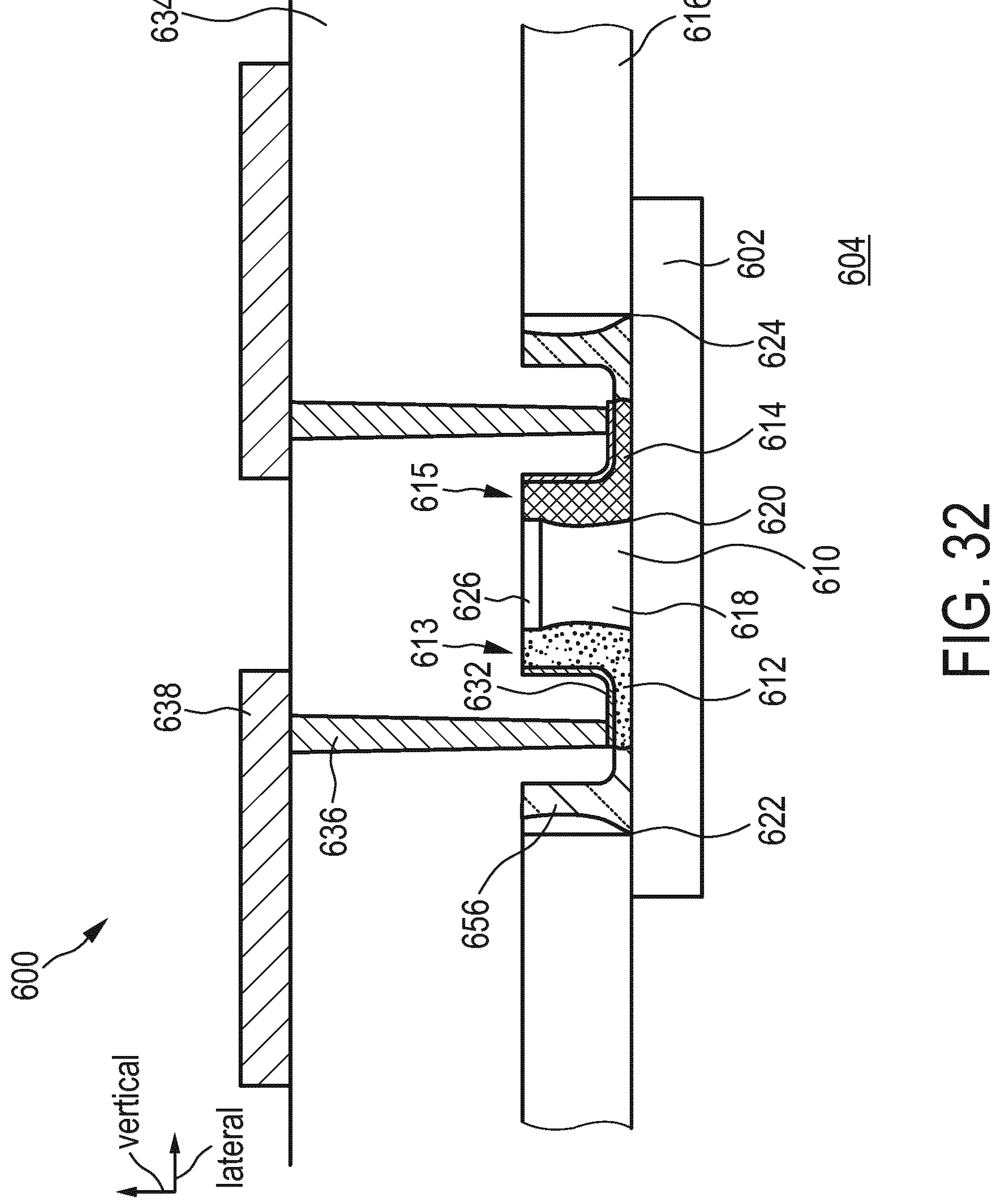
FIG. 32 shows in a cross-sectional view, a sixth embodiment of the diode.

FIG. 32 shows in a cross-sectional view, a sixth embodiment of the diode 600. The reference signs are equivalent to the ones used for the third embodiment of the diode 300 with changed hundred digits from 3xx to 6xx. In contrast to the third embodiment of the diode 300, the p-doped region 612 has a L-like form and the n-doped region has a mirror-inverted L-like form. This form is produced by using a template insulator region 656 made of SiN when producing the diode as will be described in further detail with respect to the eighth embodiment of the diode 800 shown in FIGS. 44 to 60.

In contrast to the eight embodiment, the sixth embodiment has contacting parts 613 and 615 of the p-doped region and n-doped region which contact the intrinsic region which have a vertical height that is as high as the vertical highest point of the Si capping layer 626 arranged on top of the intrinsic region 618. This results by a CMP step in which the vertical extending parts of the contacting parts 613 and 615 are removed.

Further embodiments of the method for producing embodiments of the diode are described in the following with respect to the FIGS. 33-43, with respect to the FIGS. 44-60, as well as with respect to the FIGS. 61-66.

Figures 41, 42, 43:
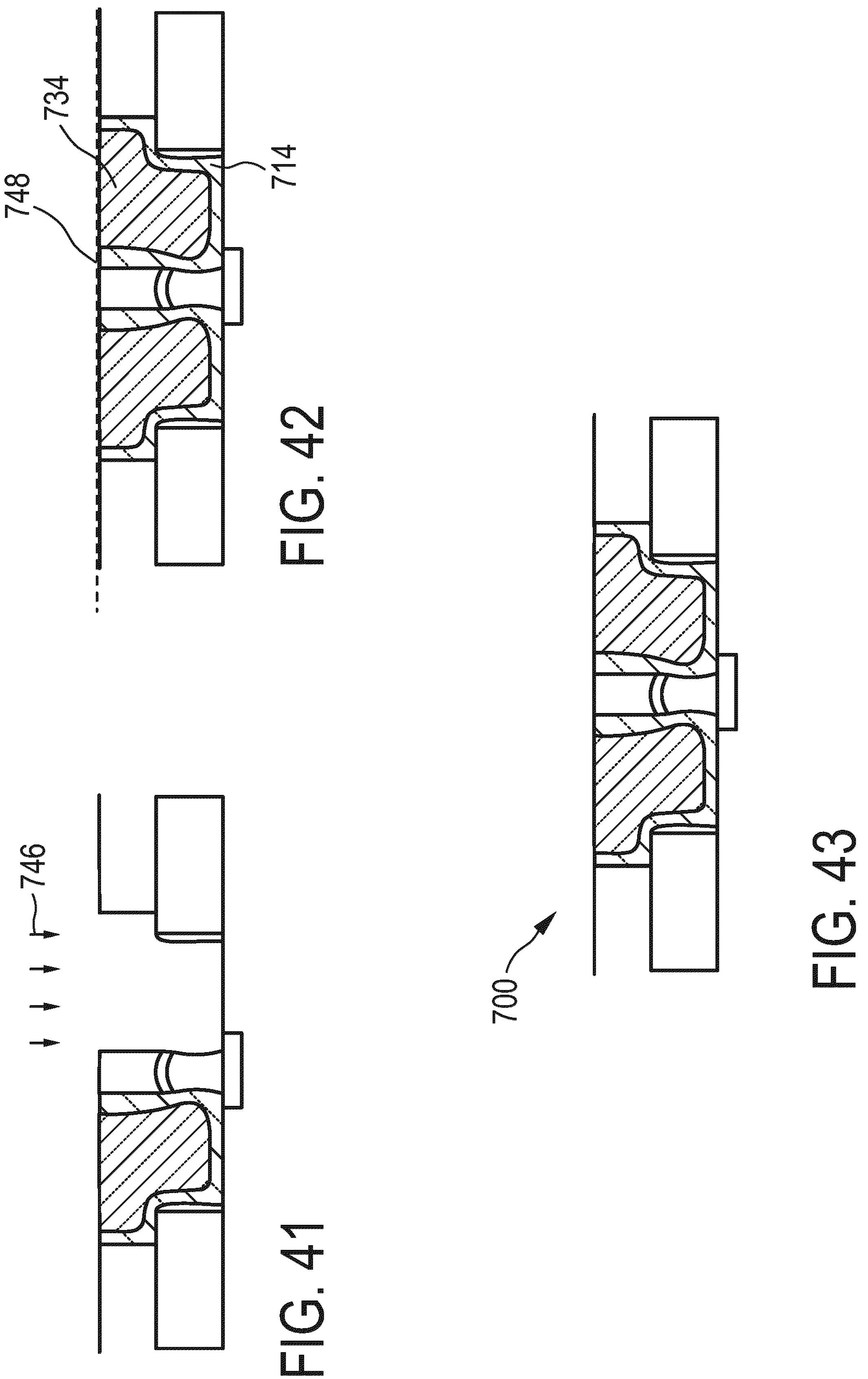

FIGS. 33-43 show, in respective cross-sectional views, subsequent processing stages in another embodiment of the method for producing a seventh embodiment of the diode 700 as shown in FIG. 43. The main difference compared to the third embodiment of the diode 300 and the respective method for producing it is that a shorter waveguide is provided which does not laterally fill the epitaxy window.

Figure 34:
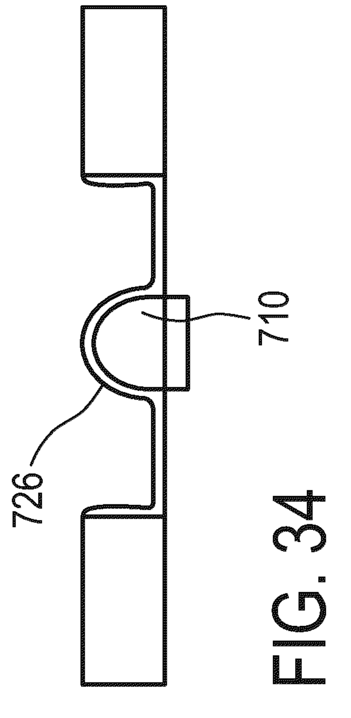
FIGS. 33-43 show, in respective cross-sectional views, subsequent processing stages in another embodiment of the method for producing a seventh embodiment of the diode as shown in FIG. 43.
Figure 36:
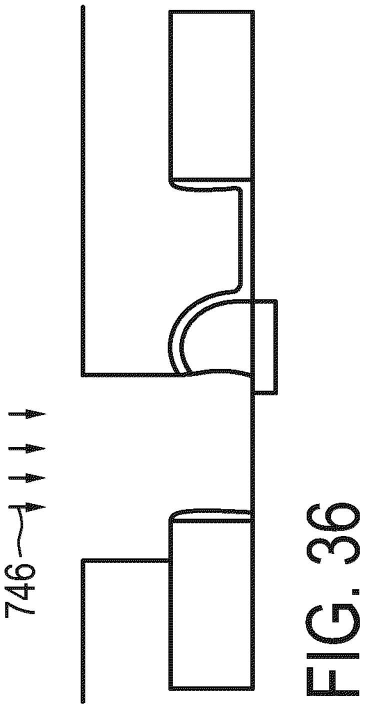
Figure 33:
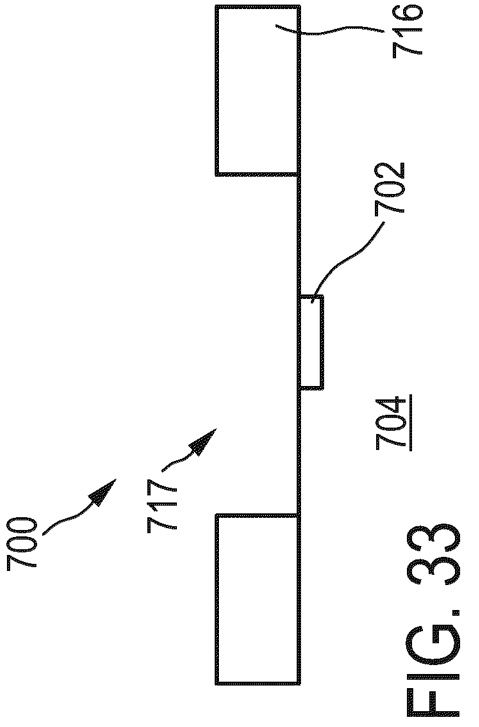
Figure 35:
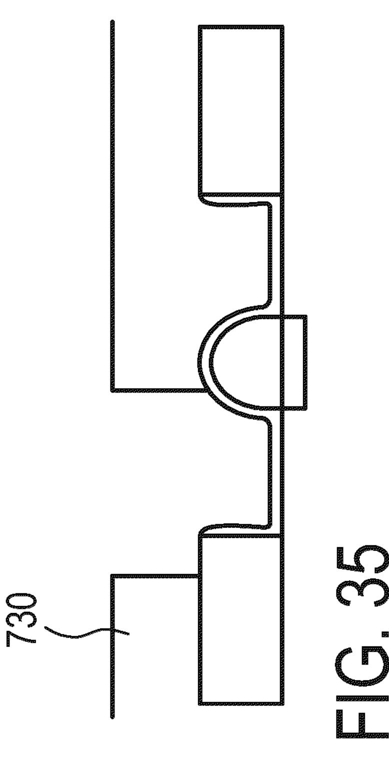
Figure 38:
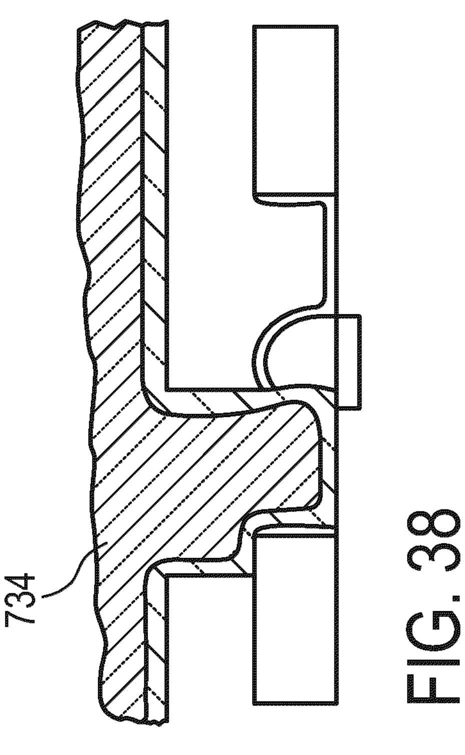
Figure 40:
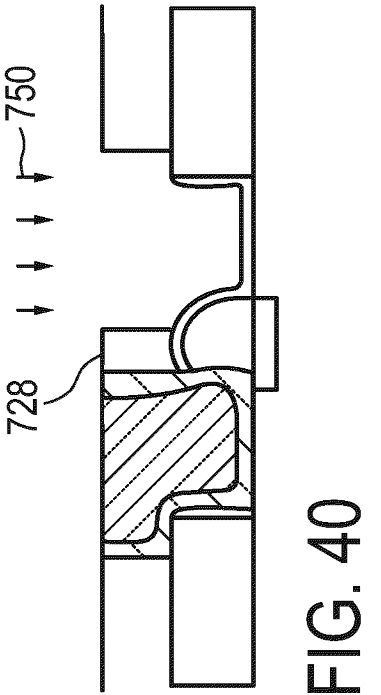
Figure 37:
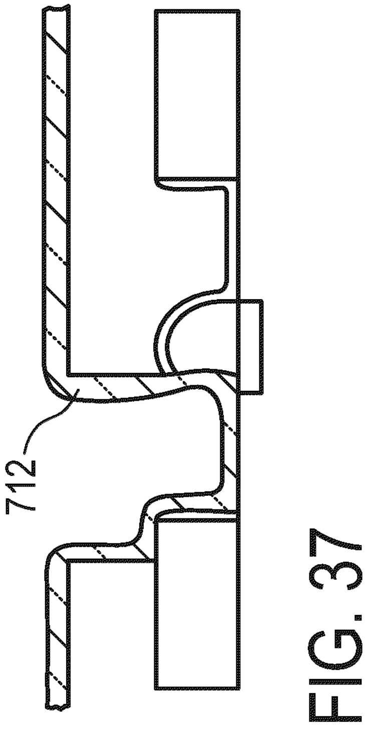
Figure 39:
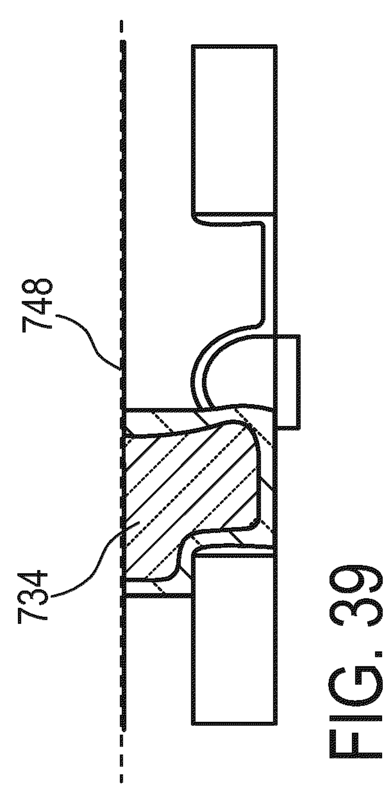

In FIG. 33, a waveguide 702 made of Si is provided embedded and on the BOX layer 704. The waveguide 702 in contrast to embodiment three of the diode, does not fill the whole epitaxy window 717 defined by the insulator region 716. FIG. 34 shows selective epitaxial growth of the intrinsic region 710 made of Ge on the waveguide 702 and application of an optional capping layer 726 made of Si. Additionally, CMP is performed for removing the capping layer parts outside of the epitaxy window 717. FIG. 35 shows application of a hard mask 730 made of $SiO_2$. FIG. 36 shows removing part of the intrinsic region 710 for structuring it. In this embodiment, dry etching, e.g., RIE, is used. FIG. 37 shows differential epitaxy of in-situ doped region 712 followed by adding insulator layer 734 in FIG. 38. In FIG. 39 CMP is performed along line 748. In FIG. 40 the other lateral side of the intrinsic region 710 is opened using lithography and dry etching 750, such that the insulator region 728 is formed above the intrinsic region 710. FIG. 41 shows removing part of the intrinsic region 710 for structuring it by dry etching 746, e.g. RIE. FIG. 42 shows differential epitaxial growth of in-situ doped Si for providing the n-doped region 714, adding an insulator layer 734 followed by CMP along line 748 for removing parts of the in-situ doped Si and the insulator layer 734 above the mask 730.

Figure 59:
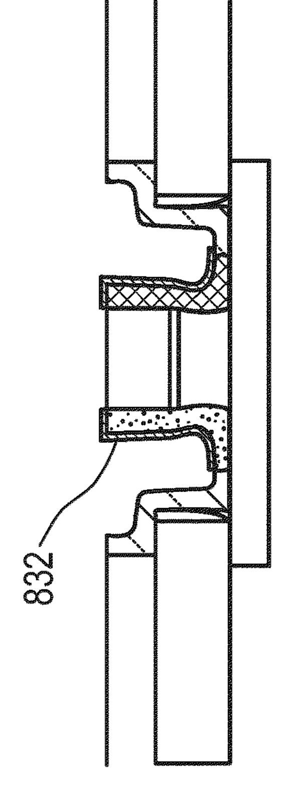
Figure 60:
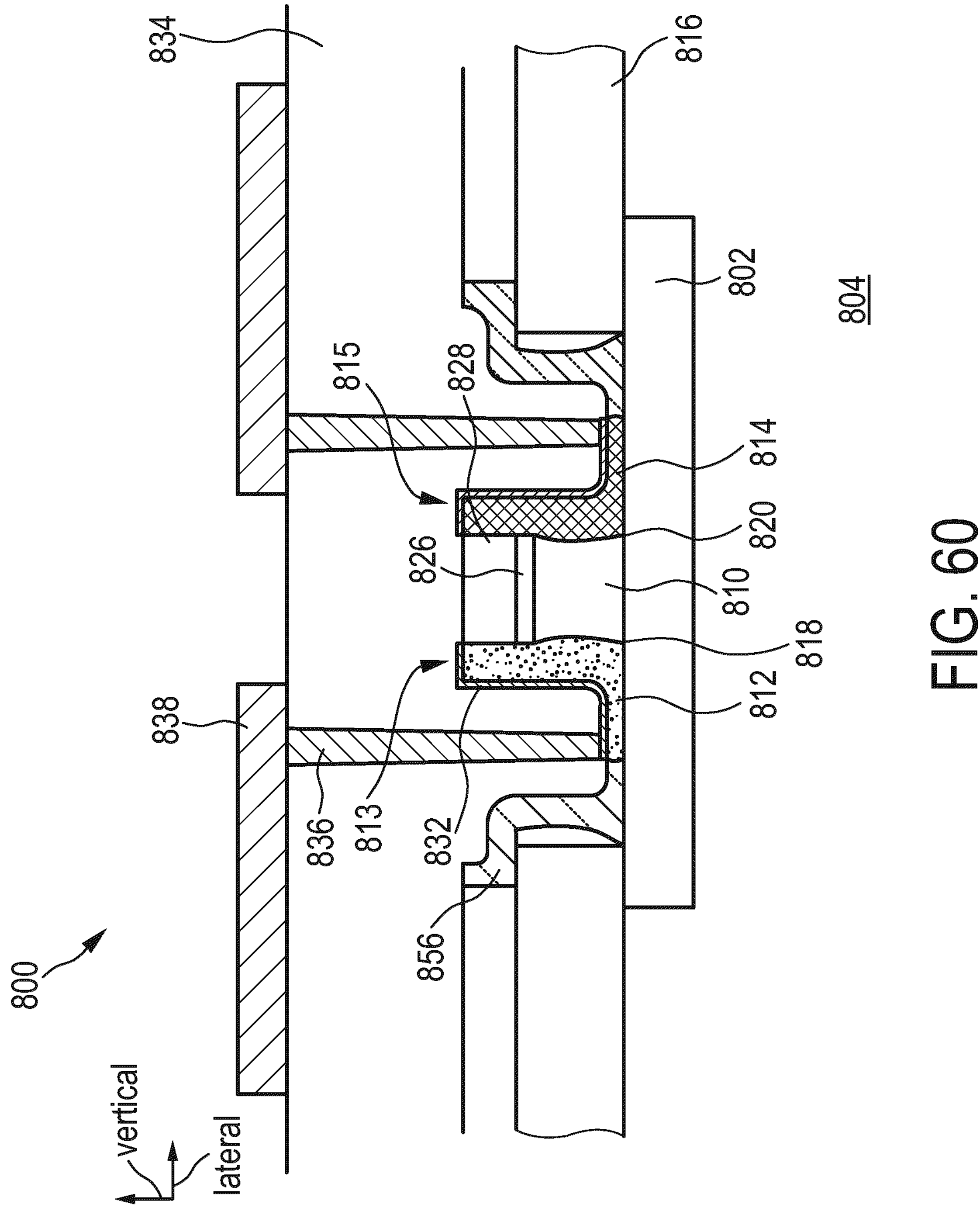

FIGS. 44-60 show, in respective cross-sectional views, subsequent processing stages in another embodiment of the method for producing an eighth embodiment of the diode 800 as shown in FIG. 60.

Figures 44, 45, 46, 47:
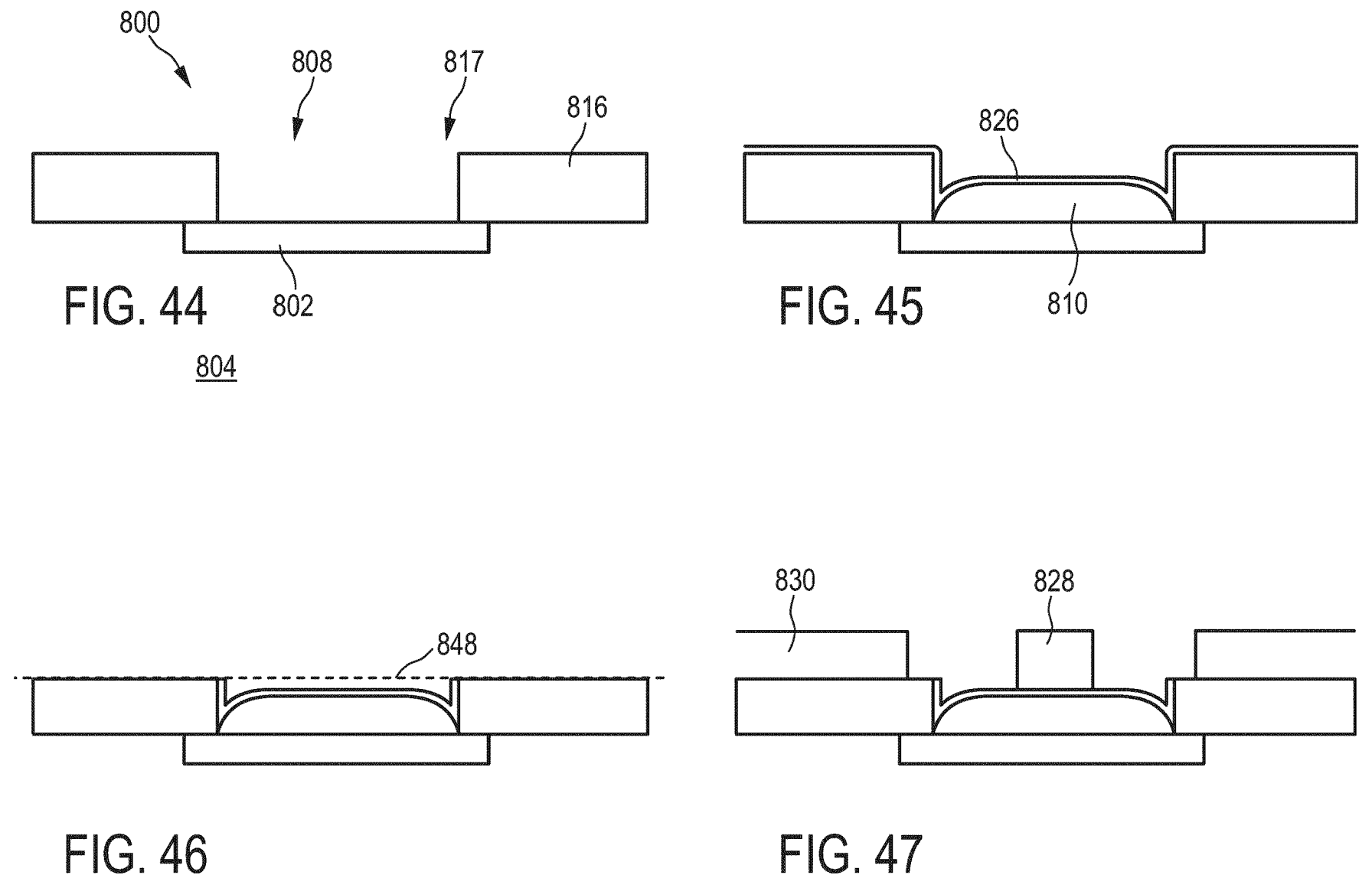

In FIG. 44 a processing stage for producing diode 800 is shown. A SOI wafer is provided with a $SiO_2$ BOX layer 804 on top of which a waveguide 802 is arranged. In other embodiments, a bulk-Si wafer may be provided. An epitaxial growth window 817 defining a diode region 808 is provided by insulator layer 816 made of $SiO_2$.

In FIG. 45 intrinsic region 810 made of a second material is grown by selective epitaxy in the diode region 808 on the waveguide 802. Optionally, a capping layer 826 made of $SiO_2$ is grown by differential growth on top of the intrinsic region 810.

In FIG. 46 parts of the capping layer 826 outside of the diode region 808 are removed by CMP along line 848. This step is optional and may only be performed in case that capping layer 826 was differentially grown.

In FIG. 47 a first mask 830 is provided on top of a part of the diode region 808. In this embodiment, the mask 830 is formed, such that an insulator layer 828 is arranged above a center of the intrinsic region 810 which will form the structured intrinsic region 810 of the diode 800 after finishing its production.

Figure 48:
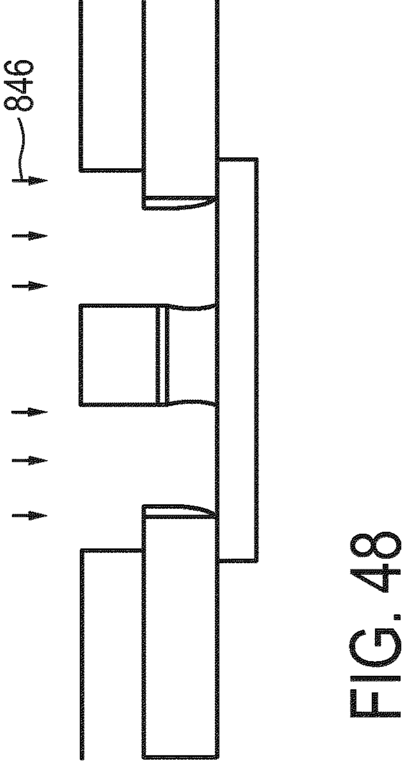

In FIG. 48 part of the intrinsic region 810 in the diode region 808 is removed for structuring the intrinsic region 810 by dry etching 846 via the mask 830. Optionally also part of the capping layer 826 arranged above the intrinsic region 810 is removed using the mask 830 and dry etching 846.

Figure 49:
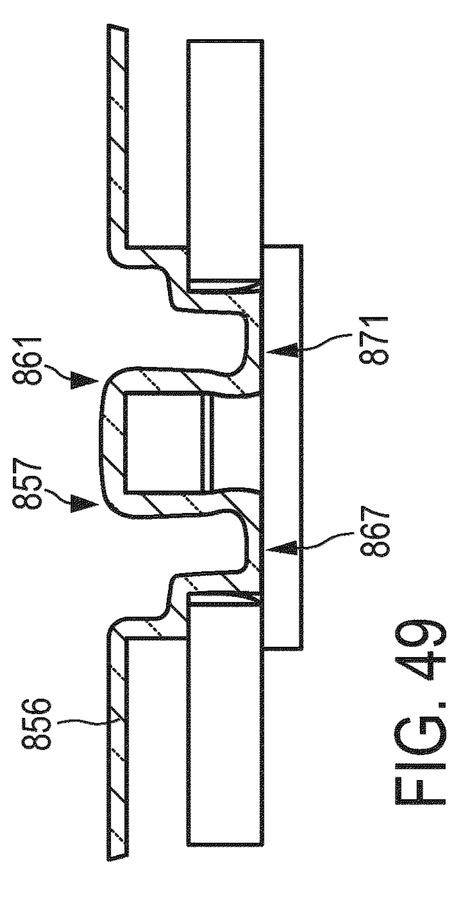

FIG. 49 shows differential growth of an insulator region 856 made of a first type of insulator, e.g., SiN, on top of the diode region 808 such that the insulator region 856 has at least two vertically extending contacting parts 857 and 861 each in contact with a side of the intrinsic region 810 such that the intrinsic region 810 is sandwiched laterally between the vertically extending contacting parts 857 and 861 of the insulator region 856 in the direction transverse to a direction of light propagation in the diode 800, respectively waveguide 802. Furthermore, the insulator region 856 has two lateral parts 867 and 871 each connected with one of the vertically extending contacting parts 857 and 861 and extending away in lateral direction from the intrinsic region 810.

Figure 50:
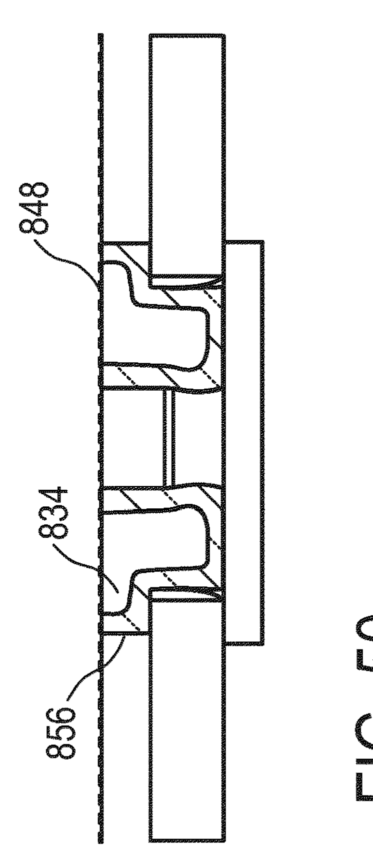

In FIG. 50 insulator material 834 made of a second type of insulator, e.g., $SiO_2$, is provided on top of the insulator region 856 and CMP is performed along line 848 in order to remove parts of the insulator region 856 and insulator material 834 above the intrinsic region 810 and above the vertically contacting parts 857 and 861 of the insulator regions 856 which contact the intrinsic region 810.

Figure 51:
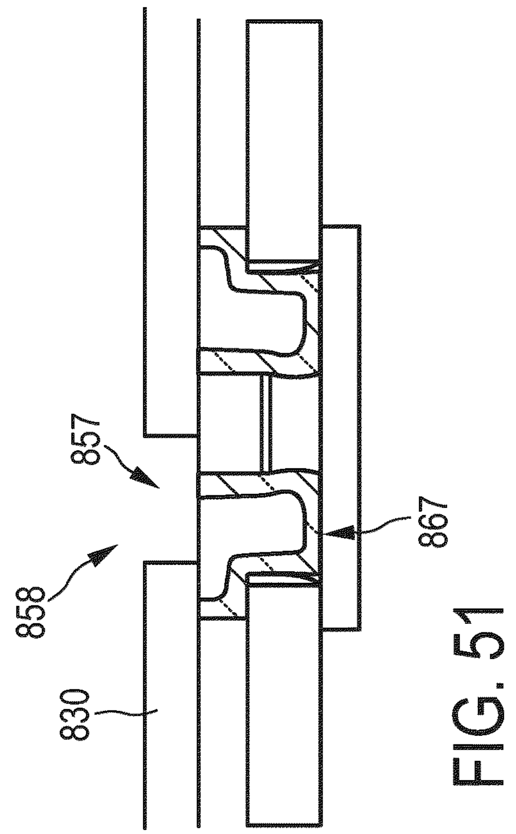

In FIG. 51 a second mask 830, e.g., made of $SiO_2$ or photoresist, is provided above the diode region 808 such that a window 858 is provided above contacting part 857 of the insulator region 856.

In FIG. 52 the contacting part 857 is removed by wet etching 859. In this embodiment, additionally a part of the lateral part 867 connected to the contacting part 857 is removed. Thereby a first cavity 882 in contact with the intrinsic region 810 is formed. In other embodiments, the cavity may have a different form, e.g., removing more or less material of the lateral part, e.g., by lateral undertech.

In FIG. 53 the first cavity 882 is filled with an in-situ doped region 812 made of the first material doped with the first type of dopant in order to provide the p-doped region 812. In this embodiment, differential epitaxy of in-situ doped Si doped with the first type of dopant, i.e., boron, is performed. In other embodiments, the n-doped region may be provided at first. Furthermore, selective epitaxy of the in-situ doped Si may be performed instead.

In FIG. 54 parts of the in-situ doped region 812 are removed outside of the diode region 808 and above the first mask 830 by performing CMP along line 848. This furthermore removes the second mask. In other embodiments, this step may not need to be performed, e.g., in case that selective epitaxy of the in-situ doped material for providing the doped regions is used.

In FIG. 55 a third mask 830, e.g., a hardmask made of $SiO_2$, is provided above the diode region 808 such that a window 863 is provided above the other contacting part 861 of the insulator regions 856. Additionally, the contacting part 861 is removed by wet etching 859. In this embodiment, additionally a part of the lateral part 871 connected to the contacting part 861 is removed. Thereby a second cavity 884 in contact with the intrinsic region 810 is formed. In other embodiments, the cavity may have a different form, e.g., removing more or less material of the lateral part, e.g., by lateral undertech.

Figure 56:
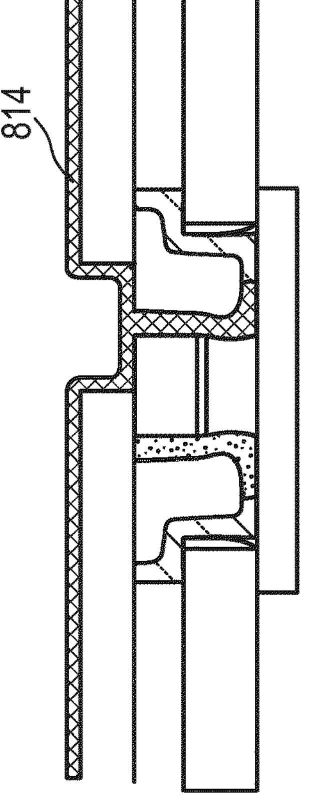

In FIG. 56 the second cavity 884 is filled with an in-situ doped region 814 made of the third material doped with the second type of dopant in order to provide the n-doped region 814. In this embodiment, the first material and the third material have the same material composition. In this embodiment, differential epitaxy of in-situ doped Si doped with the second type of dopant, i.e., phosphorous, is performed. In other embodiments, selective epitaxy of the in-situ doped Si may be performed instead.

Figure 57:
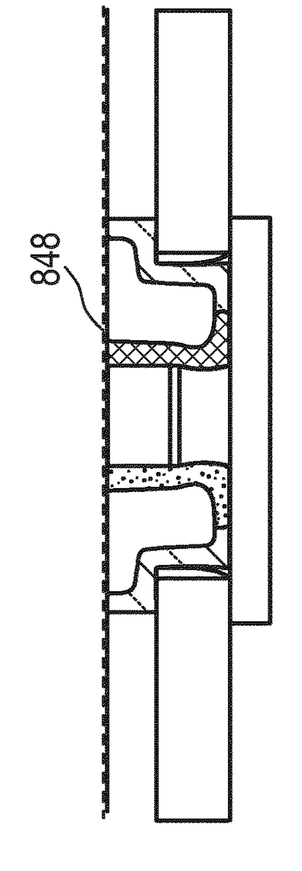

In FIG. 57 parts of the in-situ doped region 814 are removed outside of the diode region 808 and above the first mask 830 by performing CMP along line 848. This furthermore removes the third mask.

Figure 58:
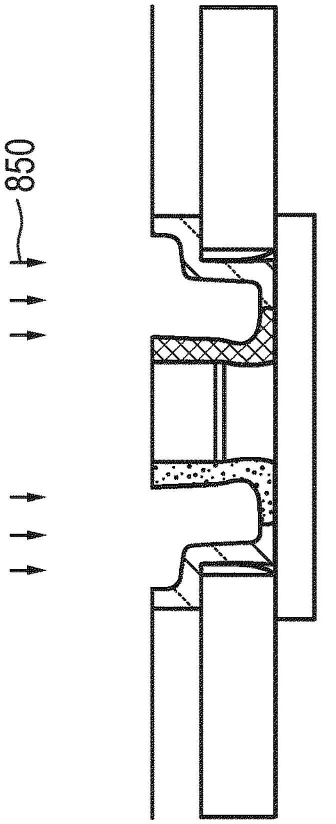

In FIG. 58 the insulator material 834 is removed from the top of the in-situ doped regions 812 and 814 by dry etching or wet etching of the $SiO_2$ in order to prepare them for silicidation, e.g., by self-aligned silicidation, also called salicidation. By removing the insulator material 834 the Si of the in-situ doped regions 812 and 814 is exposed such that salicidation may be performed as shown in FIG. 59 for providing silicide layers 832 made of $CoSi_2$ or NiSi on respective top surfaces of the doped regions 812 and 814. Silicide formation may be performed as known in the prior art BEOL processes.

FIG. 60 shows the silicide layers 832 contacted with metal structures 838 in form of AlCu metal electrodes. Therefore, W metal connectors 836 connect the metal structures 838 with the silicide layer 832 in order to allow applying an operating voltage to the diode 800.

Figure 66:
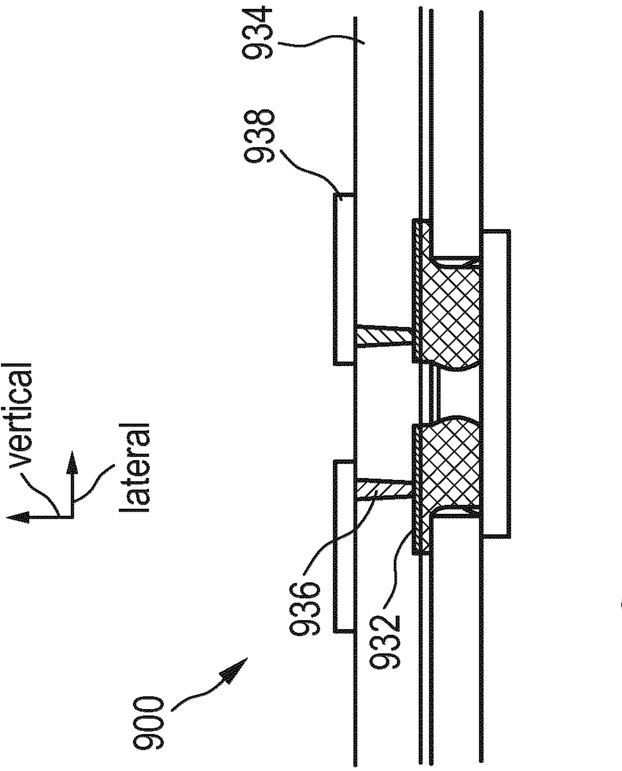

FIGS. 61-66 show, in respective cross-sectional views, subsequent processing stages in another embodiment of the method for producing a ninth embodiment of the diode 900 as shown in FIG. 66.

The processing stages are similar to the ones presented with respect to the third embodiment of the diode 300. In contrast to the processing stages of diode 300, in this embodiment, the in-situ doped regions are provided as thick layers, i.e., they fill the whole respective recess generated when structuring the intrinsic region, such that no additional insulator layer needs to be applied on top of them.

FIG. 61 shows a processing stage in which hardmask 930, e.g., made of $SiO_2$, is provided above optional capping layer 926, e.g., made of $SiO_2$, arranged on intrinsic region 910 which is arranged on waveguide 902, made of Si. The waveguide 902 is arranged above and embedded in BOX layer 904, e.g., made of $SiO_2$. An epitaxy window 917 is defined by insulator layer 916 and a further window by hardmask 930.

FIG. 62 shows structuring the intrinsic region 910 by dry etching 946 in order to remove a part of the intrinsic region 910.

FIG. 63 shows epitaxial growth of in-situ doped Si in order to form p-doped region 912. In contrast to the processing of diode 300, here more in-situ doped Si is provided, such that a recess below the window defined by hardmask 930 is filled.

In FIG. 64 excess in-situ doped Si is removed by CMP along line 948.

Figure 65:
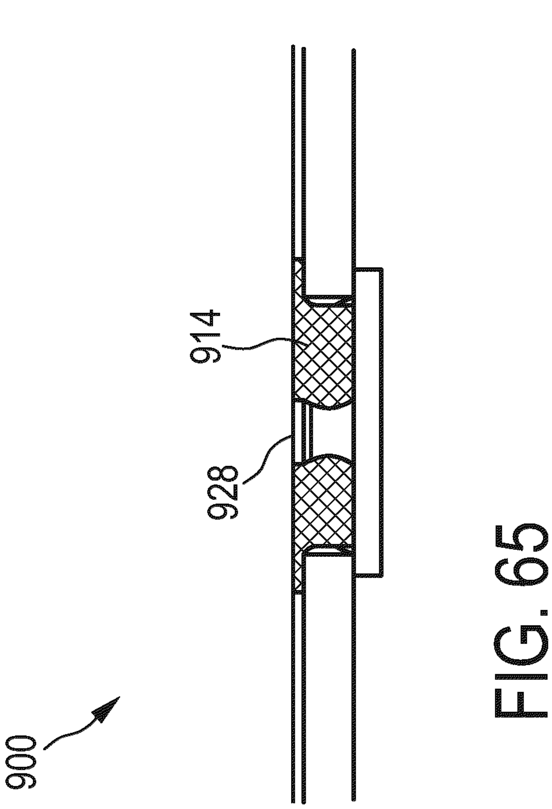

In FIG. 65 a processing stage is shown after a similar process as presented in FIGS. 63 and 64 is performed for the n-doped region.

FIG. 66 shows contacting of the diode 900 using silicide layers 932, W metal connectors 936, and metal electrodes 938, e.g., made of AlCu, as described with respect to the other embodiments of the method.

Figure 67:
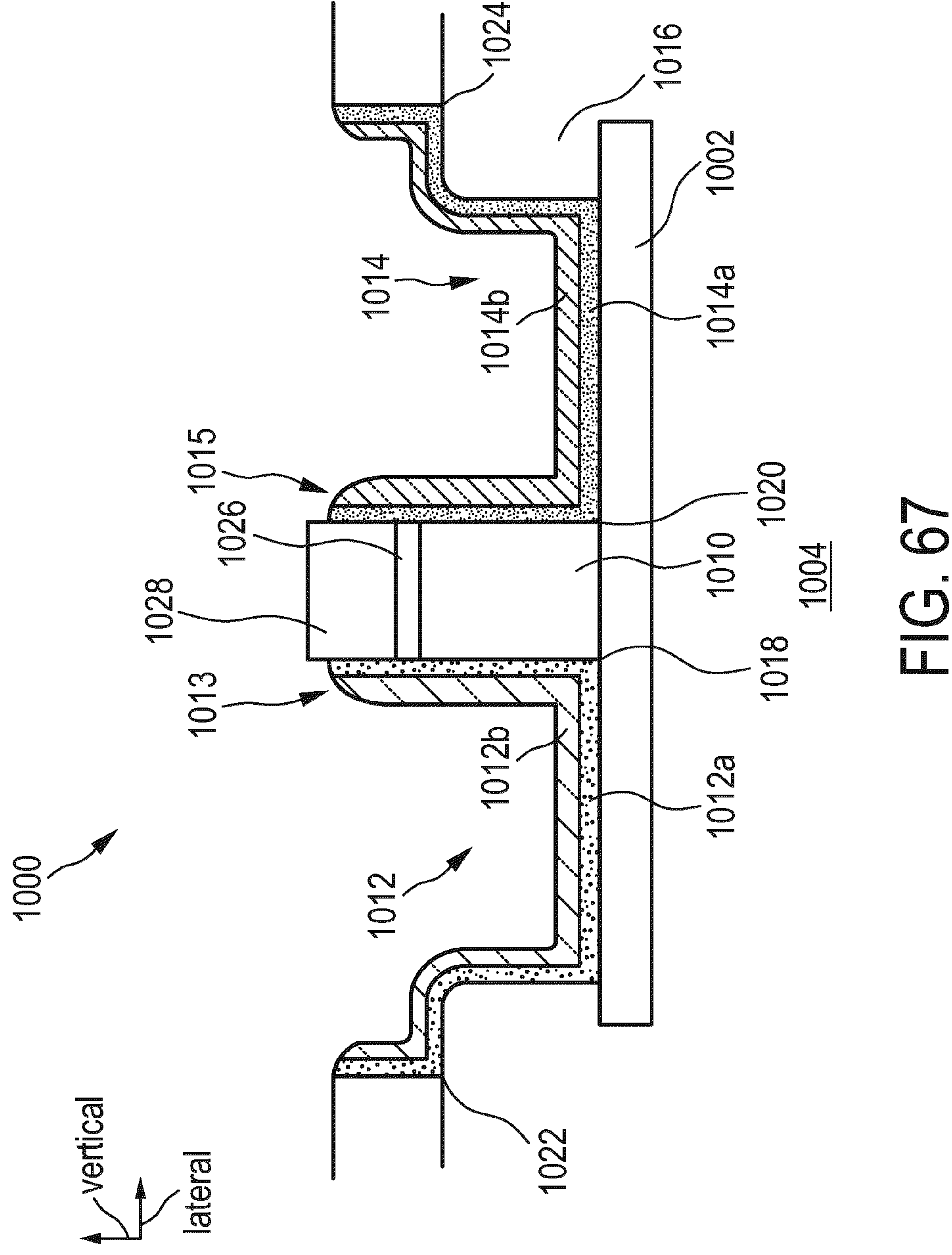
FIG. 67 shows, in a cross-sectional view, a tenth embodiment of the diode.

FIG. 67 shows in a cross-sectional view, a tenth embodiment of the diode 1000. The reference signs are equivalent to the ones used for the third embodiment of the diode 300 with changed hundred digits from 3xx to 10xx. Furthermore, some features present in diode 1000 are not shown in the FIG. 67 for a better overview, e.g., the electrical contacting via the metal connectors and metal silicide layers.

In contrast to the third embodiment of the diode 300, in the diode 1000 an overall p-doped region 1012 is formed by p-doped region 1012*a* and *p*-doped region 1012*b* arranged above the p-doped region 1012*a* such that they form the overall p-doped region 1012 in form of a material stack of p-doped regions made of different materials. In this embodiment, the p-doped region 1012*a* is made of SiGe and the p-doped region 1012*b* is made of Si. When producing the overall p-doped region 1012, first a layer of SiGe is grown and subsequently a layer of Si is grown on the SiGe. Alternatively, the overall p-doped region may be grown using a gradient, e.g., starting with $Si_{0.1}Ge_{0.9}$ and ending with Si. In this case the ratio of Ge is reduced during growth of the p-doped region. The SiGe part of the overall p-doped region may, for example, be 150 nm thick. In this embodiment, the p-doped regions 1012*a* and 1012*b* are made of in-situ doped SiGe, and respectively in-situ doped Si, doped with a doping concentration of $10^{19}$ atoms/$cm^3$ of Boron atoms. In other embodiments, the p-doped regions 1012*a* and 1012*b* may have different doping concentrations, e.g., $10^{19}$ atoms/$cm^3$ and $10^{20}$ atoms/$cm^3$ and/or may be doped with different dopants. In yet other embodiments, the overall p-doped region may have a gradient of doping concentration, e.g., changing continuously or stepwise after certain thickness of the overall p-doped region. For example, the first 50 nm of the p-doped region in contact with the intrinsic region may have a lower doping concentration than the following 50 nm. This allows optimizing doping concentration at the interfaces of the overall p-doped region independent from each other, e.g., at the interface to the intrinsic region and at the interface to the metal silicide layer.

Furthermore, in the diode 1000 an overall n-doped region 1014 is formed by n-doped region 1014*a* and *n*-doped region 1014*b* arranged above the n-doped region 1014*a* such that they form the overall n-doped region 1012 in form of a material stack of n-doped regions made of different materials. In this embodiment, the n-doped region 1014*a* is made of SiGe and the n-doped region 1014*b* is made of Si. In other embodiments, the overall n-doped region may be grown using a gradient, e.g., starting with $Si_{0.1}Ge_{0.9}$ and ending with Si. In this case the ratio of Ge is reduced during growth of the n-doped region. The SiGe part of the overall n-doped region may, for example, be 150 nm thick. In this embodiment, the n-doped regions 1014*a* and 1014*b* are made of in-situ doped SiGe, and respectively in-situ doped Si, doped with a doping concentration of $10^{19}$ atoms/$cm^3$ of phosphorus atoms. In other embodiments, the n-doped regions 1014*a* and 1014*b* may have different doping concentrations and/or may be doped with different dopants, e.g., phosphorus and arsenic. In yet other embodiments, the overall n-doped region may have a gradient of doping concentration, e.g., changing continuously or stepwise after certain thickness of the overall n-doped region. For example, the first 50 nm of the n-doped region in contact with the intrinsic region may have a lower doping concentration than the following 50 nm.

Figures 68, 69:
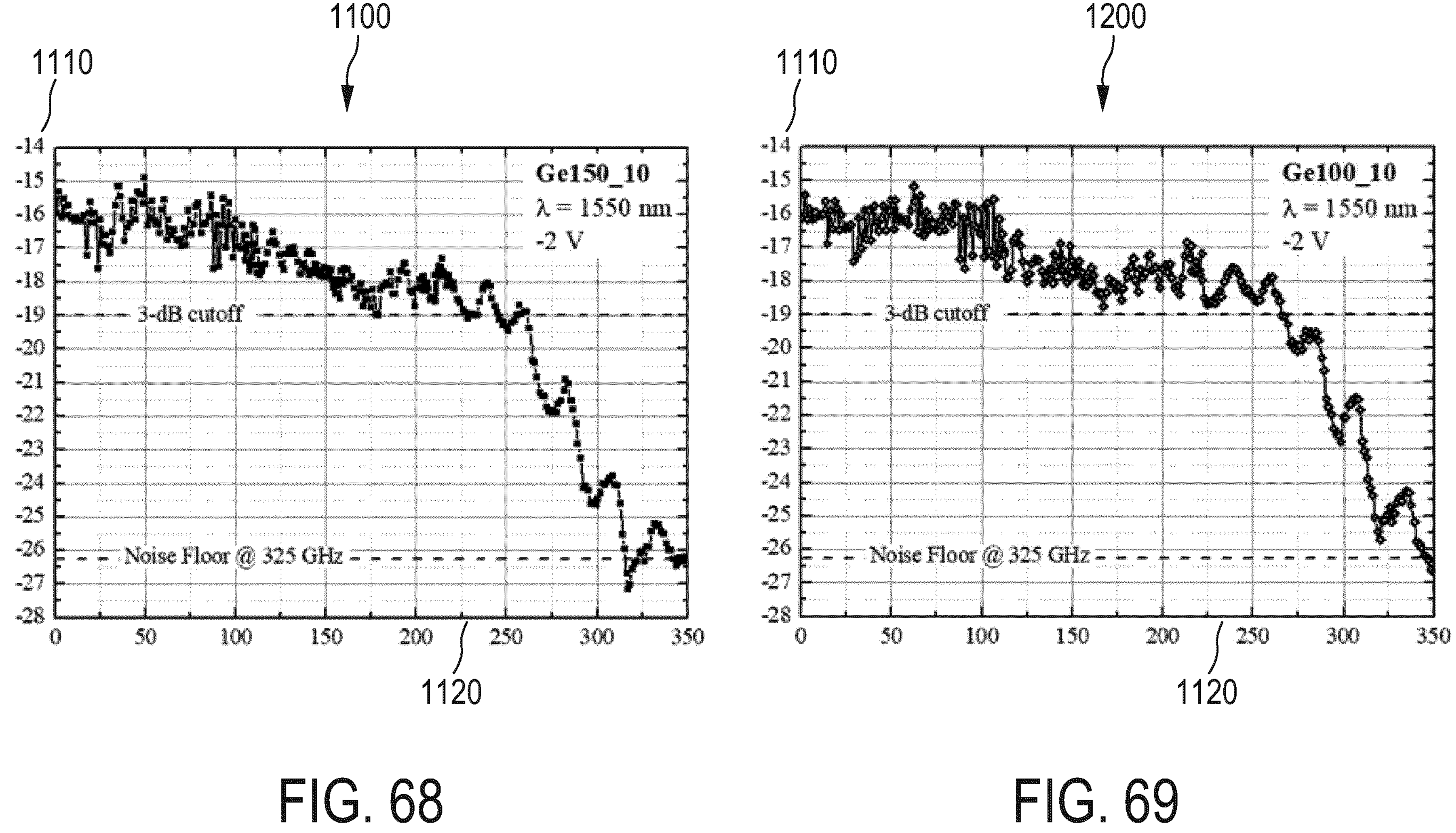
FIGS. 68 and 69 show measurement data obtained from diodes with similar structures to the diode shown in FIG. 28.

FIGS. 68 and 69 show measurement data 1100 and 1200, respectively from heterodyne measurement setup for a diode Ge150_10 with an intrinsic region having a mean lateral width of 150 nm in FIG. 68 and for diode Ge100_10 with an intrinsic region having a mean lateral width of 100 nm in FIG. 69 each measured at DC photocurrent of 1 mA. The diode structures of Ge100_10 and Ge150_10 are similar to the one of Ge-300 shown in FIG. 28 with essentially only different respective mean lateral widths. Furthermore, for the diodes Ge100_10 and Ge150_10 a dopant gradient is introduced into each of the doped regions in order to reduce out diffusion of dopants into the intrinsic region. In particular, the doping concentration increases from a lateral end of the doped region in contact with the intrinsic region to its opposing end such that the doping concentration is lowest in contact with the intrinsic region. Having such small mean lateral widths allows providing diodes with only a few hundreds of nanometers lateral width compared to micron sizes of prior art diodes. The intrinsic region of each of the diodes Ge150_10 and Ge100_10 is biconcave, has a height of 400 nm, and a length of 10 μm in the direction of light propagation in order to ensure sufficient absorption at 1550 nm wavelength. The intrinsic region of the diode Ge100_10 has a smallest lateral width of 60 nm at its center and a lateral width of 140 nm at its bottom resulting in the mean lateral width of 100 nm. The intrinsic region of the diode Ge150_10 has a smallest lateral width of 110 nm at its center and a lateral width of 190 nm resulting in the mean lateral width of 150 nm. Measurements were performed at reverse bias 2 V, i.e., −2 V. FIGS. 68 and 69 show RF power 1110 in dBm over frequency 1120 in GHz. FIG. 68 indicates a bandwidth significantly higher than shown by diodes known from the prior art, i.e., 240 GHz at −3 dB at 2 V reverse bias. FIG. 69 shows that the bandwidth for diode Ge100_10 is even higher, i.e., 265 GHz at −3 dB at −2 V.

Both diodes Ge150_10 and Ge100_10 have reasonable internal responsivity with Ge150_10 at 0.45 A/W and Ge100_10 at 0.3 A/W. Furthermore, a reasonable dark-current at room temperature has been measured for the diodes Ge150_10 and Ge100_10 with 100-200 nA at −2 V. The Ge150_10 diode has an internal bandwidth-efficiency product of 86 GHz and the Ge100_10 diode has an internal bandwidth-efficiency product of 63 GHZ.

In summary, the invention relates to a diode comprising a p-doped region, an n-doped region, and a light-sensitive intrinsic region sandwiched laterally between the p-doped region and the n-doped region in a direction transverse to a direction of light propagation in the diode. The p-doped region is made of a first material doped with a first type of dopant and the n-doped region is made of a third material doped with a second type of dopant. The first material includes Si or SiGe. The third material includes Si or SiGe. The intrinsic region is made of a second material different to at least one of the first material and the third material. The second material includes Ge, GeSn, or SiGe. The intrinsic region has a maximal lateral extension between two lateral ends of the intrinsic region of equal to or below 400 nm. The p-doped region and the n-doped region are in-situ doped such that the intrinsic region is not doped when the diode is produced.

The invention claimed is:

1. A diode comprising:

a p-doped region, an n-doped region, and a light-sensitive intrinsic region sandwiched laterally between the p-doped region and the n-doped region in a direction transverse to a direction of light propagation in the diode, wherein the p-doped region is made of a first material doped with a first type of dopant and the n-doped region is made of a third material doped with a second type of dopant, the first material including silicon or silicon germanium, the third material including silicon or silicon germanium, and wherein the intrinsic region is made of a second material different to at least one of the first material and the third material, the second material including germanium, germanium tin, or silicon germanium, wherein the intrinsic region has a maximal lateral extension between two lateral ends of the intrinsic region of equal to or below 400 nm, and wherein the intrinsic region is not doped.

2. The diode according to claim 1, comprising a waveguide arranged below and in direct contact with at least the intrinsic region and wherein the waveguide extends to the lateral ends of the intrinsic region or beyond the lateral ends of the intrinsic region in lateral direction, or wherein the waveguide extends beyond the p-doped region, the intrinsic region, and the n-doped region in lateral direction.

3. The diode according to claim 2, wherein the waveguide extends at least 100 nm in lateral direction beyond a lateral end of the p-doped region and wherein the waveguide extends at least 100 nm in lateral direction beyond a lateral end of the n-doped region.

4. The diode according to claim 3, wherein at least one of the p-doped region and the n-doped region includes a dopant gradient such that a doping concentration of the at least one of the p-doped region and the n-doped region is lowest in contact with the intrinsic region in order to reduce out diffusion of dopants into the intrinsic region.

5. The diode according to claim 1, wherein at least one of the p-doped region and the n-doped region includes a dopant gradient such that a doping concentration of the at least one of the p-doped region and the n-doped region is lowest in contact with the intrinsic region in order to reduce out diffusion of dopants into the intrinsic region.

6. The diode according to claim 5, wherein the intrinsic region has a planar bottom surface and its vertical surfaces contacting the p-doped region and the n-doped region are perpendicular to the planar bottom surface or have a convex or concave form such that the intrinsic region has a biconvex or biconcave form.

7. The diode according to claim 6, wherein material of the p-doped region and the n-doped region extends into recesses caused by the biconcave form of the intrinsic region or wherein a respective surface of the p-doped region and the n-doped region contacting a respective one of the convex vertical surfaces of the intrinsic region has a positively contacting concave form.

8. The diode according to claim 1, wherein the intrinsic region has a planar bottom surface and its vertical surfaces contacting the p-doped region and the n-doped region are perpendicular to the planar bottom surface or have a convex or concave form such that the intrinsic region has a biconvex or biconcave form.

9. The diode according to claim 8, wherein material of the p-doped region and the n-doped region extends into recesses caused by the biconcave form of the intrinsic region or wherein a respective surface of the p-doped region and the n-doped region contacting a respective one of the convex vertical surfaces of the intrinsic region has a positively contacting concave form.

10. The diode according to claim 1, wherein a respective contacting part of each of the p-doped region and the n-doped region which contacts the intrinsic region extends vertically beyond a vertically highest point of the intrinsic region.

11. The diode according to claim 1, wherein the diode comprises a capping layer arranged on top of the intrinsic region.

12. The diode according to claim 1, wherein a silicide layer is arranged on a top surface of each of the p-doped region and the n-doped region.

13. The diode according to claim 12, comprising vertically extending metal connectors which connect the silicide layers to metal structures which are arranged in a first horizontal structured metal plane and which allow an operating voltage to be applied to the diode.

14. An optoelectronic component including a diode according to claim 1 and at least one additional optical or optoelectronic constituent which is in optical communication with the diode.

15. The diode according to claim 1, wherein the intrinsic region has a maximal lateral extension between two lateral ends of the intrinsic region of equal to or below 300 nm.

16. The diode according to claim 1, wherein the intrinsic region has a maximal lateral extension between two lateral ends of the intrinsic region of equal to or below 200 nm.

17. A method for producing a diode comprising the steps:

providing a light-sensitive intrinsic region sandwiched laterally between a p-doped region and an n-doped region in a direction transverse to a direction of light propagation in the diode by sequentially providing the p-doped region in-situ doped and the n-doped region in-situ doped, and not doping the intrinsic region, wherein the intrinsic region is produced with a maximal lateral extension between two lateral ends of the intrinsic region of equal to or below 400 nm, wherein the p-doped region is made of a first material doped with a first type of dopant and the n-doped region is made of a third material doped with a second type of dopant, the first material including silicon or silicon germanium, the third material including silicon or silicon germanium, and wherein the intrinsic region is made of a second material different to at least one of the first material and the third material, the second material including germanium, germanium tin, or silicon germanium.

18. The method according to claim 17, further comprising one or more of the following steps:

providing a waveguide arranged below and in direct contact with at least the intrinsic region, providing the waveguide and the n-doped region such that the waveguide extends to the lateral ends of the intrinsic region or beyond the lateral ends of the intrinsic region in lateral direction, providing the waveguide, the p-doped region, the intrinsic region, and the n-doped region such that the waveguide extends beyond the p-doped region, the intrinsic region, and the n-doped region in lateral direction, providing the waveguide, the p-doped region, the intrinsic region, and the n-doped region such that the waveguide extends at least 100 nm in lateral direction beyond the lateral end of the p-doped region and at least 100 nm in lateral direction beyond the lateral end of the n-doped region, providing the intrinsic region such that it has a central part with a doping concentration of less than $10^{16}$ atoms/$cm^3$, providing the intrinsic region such that it is in direct contact with the p-doped region and the n-doped region, providing the intrinsic region sandwiched laterally between the p-doped region and the n-doped region such that the p-doped region and the n-doped region contact the intrinsic region only via vertical surfaces of the intrinsic region, providing at least one of the p-doped region and the n-doped region such that the at least one of the p-doped region and the n-doped region includes a dopant gradient such that a doping concentration of the at least one of the p-doped region and the n-doped region is lowest in contact with the intrinsic region in order to reduce out diffusion of dopants into the intrinsic region, providing the intrinsic region and the waveguide, such that the intrinsic region has a planar bottom surface, structuring the intrinsic region such that its vertical surfaces contacting the p-doped region and the n-doped region are perpendicular to the planar bottom surface or have a convex or concave form such that the intrinsic region has a biconvex or biconcave form, structuring the intrinsic region by a dry etching process, structuring the intrinsic region by a reactive ion etching process, providing the intrinsic region sandwiched laterally between the p-doped region and the n-doped region such that material of the p-doped region and the n-doped region extends into recesses caused by the biconcave form of the intrinsic region, providing the intrinsic region sandwiched laterally between the p-doped region and the n-doped region such that a respective surface of the p-doped region and the n-doped region contacting a respective one of the convex vertical surfaces of the intrinsic region has a positively contacting concave form, providing a respective contacting part of each of the p-doped region and the n-doped region such that it contacts the intrinsic region and further extends vertically beyond a vertically highest point of the intrinsic region, providing a capping layer on top of the intrinsic region, providing a silicide layer on a top surface of each of the p-doped region and the n-doped region, and providing metal structures in a first horizontal structured metal plane which allow an operating voltage to be applied to the diode and vertically extending metal connectors such that the vertically extending metal connectors connect the silicide layers to the metal structures.

19. The method according to claim 17 including the steps:

providing a wafer, providing a buried oxide layer, providing the buried oxide layer on top of the wafer, providing the waveguide on top of the buried oxide layer or on top of the wafer, providing an epitaxial growth window defining a diode region, providing the intrinsic region made of the second material in the diode region, optionally providing a capping layer on top of the intrinsic region, providing a mask on top of a part of the diode region, optionally removing part of the capping layer, removing part of the intrinsic region in the diode region, providing an in-situ doped region made of the first material doped with the first type of dopant or made of the third material doped with the second type of dopant in the diode region in order to provide one of the p-doped and n-doped regions, removing parts of the in-situ doped region outside of the diode region and above the mask, providing insulator material on top of the in-situ doped region inside of the diode region, removing a part of the mask such that one part of the mask covers a part of the intrinsic region between the removed part of the mask and the in-situ doped region in order to provide the intrinsic region (310) sandwiched laterally between the p-doped region and the n-doped region, removing part of the capping layer in the region of the removed part of the mask, removing part of the intrinsic region in the region of the removed part of the mask, providing another in-situ doped region in the diode region in order to provide the other one of the p-doped and n-doped regions, the other in-situ doped region being made of the third material doped with the second type of dopant or made of the first material doped with the first type of dopant, removing parts of the other in-situ doped region outside of the diode region and above the in-situ doped region, providing insulator material on top of the other in-situ doped region in the region of the removed part of the mask, removing the insulator material on top of the in-situ doped regions, providing a silicide layer on top of each of the in-situ doped regions, and contacting the silicide layers with metal structures.

20. A method according to claim 17, comprising the steps:

providing a wafer, optionally providing a buried oxide layer, providing the buried oxide layer on top of the wafer, providing the waveguide on top of the buried oxide layer or on top of the wafer, providing an epitaxial growth window defining a diode region, providing the intrinsic region made of the second material in the diode region, providing a capping layer on top of the intrinsic region, removing parts of the capping layer outside of the diode region, providing a first mask on top of a part of the diode region, removing part of the capping layer, removing part of the intrinsic region in the diode region, providing an insulator region made of a first type of insulator on top of the diode region such that the insulator region has at least two vertically extending contacting parts each in contact with a side of the intrinsic region such that the intrinsic region is sandwiched laterally between the vertically extending contacting parts of the insulator region made of the first type of insulator in the direction transverse to a direction of light propagation in the diode and two lateral parts each connected with one of the vertically extending contacting parts and extending away in lateral direction from the intrinsic region, providing insulator material made of a second type of insulator on top of the insulator region made of the first type of insulator, removing parts of the insulator region made of the first type of insulator and insulator material made of the second type of insulator above the intrinsic region and above the vertically contacting parts of the insulator regions made of the first type of insulator which contact the intrinsic region, providing a second mask above the diode region such that a window is provided above one of the contacting parts of the insulator region made of the first type of insulator, removing the one of the contacting parts and optionally a part of the lateral part connected to the one of the contacting parts of the insulator region made of the first type of insulator, such that a first cavity in contact with the intrinsic region is formed, filling the first cavity with an in-situ doped region made of the first material doped with the first type of dopant or made of the third material doped with the second type of dopant in order to provide one of the p-doped and n-doped regions, removing parts of the in-situ doped region outside of the diode region and above the first mask, providing a third mask above the diode region such that a window is provided above the other one of the contacting parts of the insulator regions made of the first type of insulator, removing the other one of the contacting parts and optionally a part of the lateral part connected to the other one of the contacting parts of the insulator region made of the first type of insulator, such that a second cavity in contact with the intrinsic region is formed, filling the second cavity with another in-situ doped region in order to provide the other one of the n-doped and p-doped regions, the other in-situ doped region being made of the third material doped with the second type of dopant or made of the first material doped with the first type of dopant, removing parts of the other in-situ doped region outside of the diode region and above the first mask, removing the insulator material made of the second type of insulator from the top of the in-situ doped regions, providing a silicide layer on top of each of the in-situ doped regions, and contacting the silicide layers with metal structures.

* * * * *